(12) United States Patent
Godo et al.

(10) Patent No.: US 9,799,773 B2
(45) Date of Patent: Oct. 24, 2017

(54) TRANSISTOR AND SEMICONDUCTOR DEVICE

(75) Inventors: Hiromichi Godo, Kanagawa (JP); Satoshi Kobayashi, Kanagawa (JP); Masashi Tsubuku, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 816 days.

(21) Appl. No.: 13/358,556

(22) Filed: Jan. 26, 2012

(65) Prior Publication Data

US 2012/0193620 A1    Aug. 2, 2012

(30) Foreign Application Priority Data

Feb. 2, 2011  (JP) ................................. 2011-021042
May 14, 2011  (JP) ................................. 2011-108901

(51) Int. Cl.
*H01L 29/78*    (2006.01)
*H01L 29/786*   (2006.01)
*H01L 29/423*   (2006.01)

(52) U.S. Cl.
CPC .... *H01L 29/7869* (2013.01); *H01L 29/42384* (2013.01)

(58) Field of Classification Search
CPC ...................... H01L 29/42384; H01L 29/7869
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 5,767,531 A * | 6/1998 | Yoshinouchi ..... H01L 29/42384 257/408 |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

(Continued)

*Primary Examiner* — Marcos D Pizarro
*Assistant Examiner* — Benjamin Tzu-Hung Liu
(74) *Attorney, Agent, or Firm* — Robinson Intellectual Property Law Office; Eric J. Robinson

(57) ABSTRACT

A transistor which withstands a high voltage and controls large electric power can be provided. A transistor is provided which includes a gate electrode, a gate insulating layer over the gate electrode, an oxide semiconductor layer which is over the gate insulating layer and overlaps with the gate electrode, and a source electrode and a drain electrode which are in contact with the oxide semiconductor layer and whose end portions overlap with the gate electrode. The gate insulating layer includes a first region overlapping with the end portion of the drain electrode and a second region adjacent to the first region. The first region has smaller capacitance than the second region.

12 Claims, 22 Drawing Sheets

(56) References Cited

U.S. PATENT DOCUMENTS

| | | | |
|---|---|---|---|
| 6,294,274 B1 | 9/2001 | Kawazoe et al. | |
| 6,346,730 B1 | 2/2002 | Kitakado et al. | |
| 6,563,174 B2 | 5/2003 | Kawasaki et al. | |
| 6,709,902 B2 | 3/2004 | Kitakado et al. | |
| 6,727,522 B1 | 4/2004 | Kawasaki et al. | |
| 6,882,016 B2 * | 4/2005 | Takenaka | H01L 27/12 257/410 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,176,068 B2 | 2/2007 | Kitakado et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,638,846 B2 | 12/2009 | Kitakado et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,935,582 B2 | 5/2011 | Iwasaki | |
| 7,956,361 B2 | 6/2011 | Iwasaki | |
| 7,977,750 B2 | 7/2011 | Kitakado et al. | |
| 8,143,678 B2 | 3/2012 | Kim et al. | |
| 8,154,024 B2 | 4/2012 | Iwasaki | |
| 8,183,099 B2 | 5/2012 | Sakata | |
| 8,541,844 B2 | 9/2013 | Kitakado et al. | |
| 8,558,323 B2 | 10/2013 | Kim et al. | |
| 8,803,149 B2 | 8/2014 | Sakata | |
| 9,012,918 B2 | 4/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0191204 A1 | 8/2008 | Kim et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2009/0008639 A1 | 1/2009 | Akimoto et al. | |
| 2009/1004539 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0244017 A1 | 9/2010 | Hoffman et al. | |
| 2010/0258802 A1 | 10/2010 | Godo et al. | |
| 2010/0264412 A1 * | 10/2010 | Yamazaki | H01L 27/12 257/43 |
| 2011/0006302 A1 * | 1/2011 | Yamazaki | H01L 27/1225 257/43 |
| 2011/0193076 A1 * | 8/2011 | Yun | H01L 27/1214 257/43 |
| 2015/0037912 A1 | 2/2015 | Sakata | |
| 2015/0214379 A1 | 7/2015 | Yamazaki et al. | |

FOREIGN PATENT DOCUMENTS

| | | |
|---|---|---|
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-053138 A | 3/1993 |
| JP | 05-251705 A | 9/1993 |
| JP | 07-131020 A | 5/1995 |
| JP | 08-264794 A | 10/1996 |
| JP | 10-173190 A | 6/1998 |
| JP | 11-505377 | 5/1999 |
| JP | 2000-044236 A | 2/2000 |
| JP | 2000-150900 A | 5/2000 |
| JP | 2001-068680 A | 3/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-165621 A | 6/2004 |
| JP | 2004-165622 A | 6/2004 |

(56) References Cited

FOREIGN PATENT DOCUMENTS

| JP | 2004-273614 A | 9/2004 |
|---|---|---|
| JP | 2004-273732 A | 9/2004 |
| JP | 2005-079283 A | 3/2005 |
| JP | 2007-096055 A | 4/2007 |
| JP | 2007-103918 A | 4/2007 |
| JP | 2007-123861 | 5/2007 |
| JP | 2008-199005 A | 8/2008 |
| JP | 2009-135185 A | 6/2009 |
| JP | 2010-010160 A | 1/2010 |
| JP | 2010-166030 A | 7/2010 |
| JP | 2010-251735 A | 11/2010 |
| WO | WO-2004/114391 | 12/2004 |
| WO | WO-2007/029844 | 3/2007 |
| WO | WO-2010/071034 | 6/2010 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

Costello.M et al., "Electroc Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, the Japan Society of Applied Physics.

Godo.H et al., "P-9:Numerical Analysis on Temperature Dependence of Characteristsics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper: Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and Yb2Fe3O7 Types of Structures for Compounds in the In2O3 and Sc2O3—A2O3—BO Systems [A; Fe, Ga or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-658.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Gal; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, the Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasm-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. Amoled Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 7A
FIG. 7B
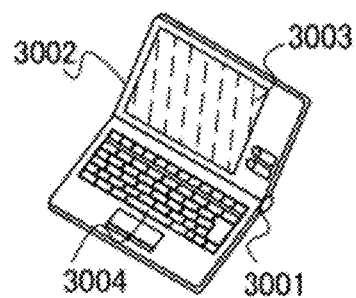
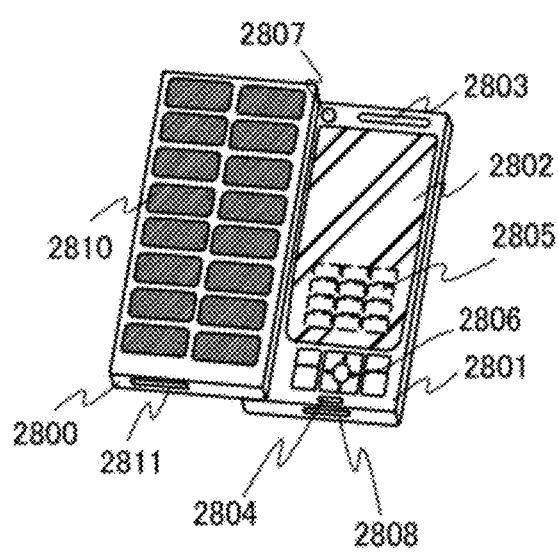

● In
☾ Sn
⟡ Zn
● O

● In
○ Ga
○ Zn
● O

TRANSISTOR AND SEMICONDUCTOR DEVICE

BACKGROUND OF THE INVENTION

1. Field of the Invention

The present invention also relates to a semiconductor device including an oxide semiconductor.

In this specification, a "semiconductor device" refers to all devices which can function by utilizing semiconductor characteristics, and electro-optical devices, semiconductor circuits, electronic components, and electronic devices are all included in the category of the semiconductor device.

2. Description of the Related Art

In a semiconductor device with high withstand voltage for controlling large current, a so-called power device, silicon has been used mainly as a semiconductor material. However, it is said that the physical characteristics of a transistor using silicon reach the theoretical value limit, and a novel semiconductor material with which the characteristics can be improved has been demanded in order to realize a power device that has high withstand voltage and can control large current. As the semiconductor material that may improve the characteristics such as high withstand voltage, high conversion efficiency, or high-speed switching, for example, an oxide semiconductor has been attracted attention.

An oxide semiconductor has a wider band gap and lower intrinsic carrier density than silicon. In addition, the oxide semiconductor is advantageous in that it can be formed by a sputtering method or a wet method (such as a printing method) and has high mass productivity. In addition, a transistor is already known in which an oxide semiconductor is used for a semiconductor layer because a deposition temperature of the oxide semiconductor is as low as 300° C. to 500° C. (lower than or equal to the glass transition temperature, or approximately 700° C. at most) and the oxide semiconductor can be deposited over a glass substrate which is inexpensively available (Patent Document 1).

REFERENCE

Patent Document

[Patent Document 1] United States Published Patent Application No. 2007/0072439

SUMMARY OF THE INVENTION

In general, it is known that when a voltage between a source and a drain is increased in a field-effect transistor, a high electric field is generated in the vicinity of the drain. Note that in this specification, the vicinity of a drain refers to a region which is included in a region where an oxide semiconductor layer and a gate electrode overlap with each other, and overlaps with an end portion of a drain electrode at a cross section in the channel length direction, and whose electric field is considerably larger than other regions due to the potential difference between the drain electrode and the gate electrode. Note that the vicinity of the drain does not include a region overlapping with the drain electrode.

An electron accelerated by the high electric field of the vicinity of the drain has a large kinetic energy. Most of electrons lose their kinetic energies due to lattice scattering. However, some electrons are not scattered and continue to be accelerated, so that their kinetic energies are increased.

When the electrons which continue to be accelerated collide with another electron-hole pair, the collided electron obtains energy and is excited into a conduction band to contribute to electric conduction. Then, the collided electron causes another collision and collision of electrons occurs repeatedly in the transistor. By a series of processes, current of the transistor is intensively increased and heat due to Joule heat is generated locally, which leads to breakdown of the transistor.

For example, it is known that silicon carbide (SiC (4H)) having a band gap substantially the same as that of an oxide semiconductor has a breakdown field strength of 3 MV/cm. When a high electric field of 3 MV/cm or more is applied to a transistor including silicon carbide, the transistor breaks down and loses a function of a transistor in some cases.

Although an oxide semiconductor is excellent in mass productivity and has an advantage of a low process temperature; however, when an oxide semiconductor is used for a transistor for controlling large electric power, a novel structure which increases resistance against breakdown needs to be provided.

Therefore, one object is to provide a transistor which controls large current and withstands a high voltage. In addition, one object is to provide a semiconductor device including the transistor.

In order to achieve the above object, the present invention has focused attention on a transistor having a structure in which an oxide semiconductor is used for a semiconductor layer and the resistance of a channel formation region in the vicinity of a drain is increased. Here, the channel formation region refers to a region which is included in the oxide semiconductor layer, located between a source electrode and a drain electrode, and overlaps with a gate electrode. When a gate voltage is applied, carriers are induced in the channel formation region. Then, when the gate voltage is higher than or equal to a predetermined value (threshold voltage), current flows between the source electrode and the drain electrode by the induced carriers.

In particular, in the case where a high voltage is applied between the source electrode and the drain electrode, a high electric field is generated in the channel formation region in the vicinity of the drain, which may cause breakdown of the transistor from the channel formation region in the vicinity of the drain.

Thus, a structure is considered in which even when a high voltage is applied to the drain electrode, the high electric field generated in the vicinity of the drain is relaxed by increasing the resistance of the channel formation region in the vicinity of the drain to prevent the breakdown of the transistor.

Specifically, in the transistor including an oxide semiconductor as the semiconductor layer, a region whose resistance is increased is formed in the channel formation region by utilizing a phenomenon in which the mobility is high in the channel formation region which overlaps with a region of the gate insulating layer which has large capacitance, whereas the mobility is low in the channel formation region which overlaps with a region of the gate insulating layer which has small capacitance.

An oxide semiconductor has a property such that its mobility is reduced when its carrier density is reduced. Therefore, when the capacitance of a gate insulating layer is reduced and the number of carriers induced (the amount of charge) is reduced, the mobility of an oxide semiconductor is reduced and the resistance thereof is increased. In contrast, when the capacitance of the gate insulating layer which overlaps with the channel formation region is increased, the number of carriers induced (the amount of charge) is increased, the mobility is increased and the resistance is reduced.

The capacitance of the gate insulating layer in the vicinity of the drain to which a high electric field is applied is reduced using such a property, which makes it possible to form a high resistance region in the channel formation region in the vicinity of the drain and relax the high electric field. As a result, the following phenomenon can be prevented: electrons are accelerated by the high electric field and the electrons each having the energy greater than the band gap flow, so that heat is generated in the transistor, the semiconductor layer is broken by the heat, which causes the breakdown of the transistor.

In addition, when the capacitance of the gate insulating layer except the vicinity of the drain is increased, the resistance of the transistor against breakdown can be increased without a reduction in the mobility in the channel formation region except the vicinity of the drain.

Therefore, one embodiment of the present invention is a semiconductor device including a gate electrode, a gate insulating layer over the gate electrode, an oxide semiconductor layer which is provided over the gate insulating layer and overlaps with the gate electrode, a first electrode which is in contact with the oxide semiconductor layer, and a second electrode which is provided in contact with the oxide semiconductor layer with a space provided between the first electrode and the second electrode. The gate insulating layer includes a first region which overlaps with the first electrode, a second region which overlaps with the second electrode, a third region which is sandwiched between the first region and the second region and in contact with the first region, and a fourth region which is sandwiched between the third region and the second region. The third region has smaller capacitance than the fourth region.

When the capacitance of the gate insulating layer in the vicinity of the first electrode functioning as a drain electrode is made smaller, the resistance of the channel formation region in the vicinity of the drain is increased. Accordingly, an electric field generated in the oxide semiconductor layer in the vicinity of the drain is reduced, so that a transistor which withstands a high voltage and does not breakdown even when a high electric field is applied to the drain electrode.

In addition, when the capacitance of the gate insulating layer except the vicinity of the drain is made larger as compared to the capacitance of the gate insulating layer in the vicinity of the drain, a reduction in the mobility of the entire transistor can be prevented, so that control of large current is possible and a semiconductor device with high resistance can be provided.

One embodiment of the present invention is the transistor in which the first region and the second region of the gate insulating layer are formed using materials having the same dielectric constant and the first region has a larger thickness than the second region.

When the gate insulating layers are formed using the materials having the same dielectric constant, the capacitance is changed depending on the thickness. Therefore, when the first region and the second region of the gate insulating layer are formed using the materials having the same dielectric constant, the capacitances of the regions can be changed only by adjusting their thicknesses and a process such as doping is unnecessary, so that the transistor which withstands a high voltage can be easily provided.

Further, one embodiment of the present invention is a semiconductor device including a gate electrode, a gate insulating layer over the gate electrode, an oxide semiconductor layer which is provided over the gate insulating layer and overlaps with the gate electrode, a first electrode in contact with the oxide semiconductor layer, and a second electrode in contact with the oxide semiconductor layer with a space between the first electrode and a second electrode. The gate insulating layer includes a first region which overlaps with the first electrode, a second region which overlaps with the second electrode, a third region which is sandwiched between the first region and the second region and provided in contact with the first region with a space provided between the second region and the third region, a fourth region which is sandwiched between the third region and the second region and provided in contact with the second region with a space between the third region and the fourth region, and a fifth region which is sandwiched between the third region and the fourth region. The third region and the fourth region each have smaller capacitance than the fifth region.

A function as a source electrode and a function as a drain electrode are exchanged between the first electrode and the second electrode depending on the structure and operation conditions of the transistor. Therefore, a region having small capacitance is provided in the gate insulating layer in the vicinities of the first electrode and the second electrode, whereby the resistance of a region to which a high electric field is applied can be increased, and the breakdown of the transistor can be prevented even in the operation condition where the function as the source electrode and the function as the drain electrode are switched.

Further, one embodiment of the present invention is the transistor in which the first region, the second region, and the third region of the gate insulating layer are formed using materials having the same dielectric constant, and the first region and the second region each have a larger thickness than the third region.

When the gate insulating layers are formed using the materials having the same dielectric constant, the capacitance is changed depending on the thickness. Therefore, when the first region, the second region, and the third region of the gate insulating layer are formed using the materials having the same dielectric constant, the capacitances of the regions can be changed only by adjusting their thicknesses and a process such as doping is unnecessary, so that the transistor which withstands a high voltage can be easily provided.

Furthermore, one embodiment of the present invention is a transistor including a first gate electrode, a first gate insulating layer over the first gate electrode, an oxide semiconductor layer which is provided over the first gate insulating layer and overlaps with the first gate electrode, a first electrode which is provided in contact with the oxide semiconductor layer and does not overlaps with the first gate electrode, and a second electrode which is provided in contact with the oxide semiconductor layer with a space between the first electrode and the second electrode. The oxide semiconductor layer in a region which is sandwiched between a first region in contact with the first electrode and a second region in contact with the second electrode and does not overlap with the first gate electrode overlaps with a second gate electrode with a second gate insulating layer having smaller capacitance than the first gate insulating layer provided therebetween.

In the transistor, the first gate insulating layer and the second gate insulating layer whose capacitance is different from that of the first gate insulating layer are provided with the oxide semiconductor layer provided therebetween and the two gate electrodes are provided with the gate insulating layers provided therebetween. In the channel formation region sandwiched between the first electrode and the second electrode in the oxide semiconductor layer, carriers are induced in a region overlapping with the first gate electrode by a voltage applied to the first gate electrode, and a channel is induced by the second gate electrode on the side of the second gate insulating layer having small capacitance in a region which does not overlap with the first electrode. Further, since the first electrode is provided so as not to overlap with the first gate electrode, carriers are induced by the second gate electrode surely in the vicinity of the first electrode.

In other words, in the vicinity of the first electrode, carriers are induced by the second gate electrode which is provided on the side of the second gate insulating layer having small capacitance, so that the resistance of the vicinity of a region to which a high voltage is applied is increased and a high electric field due to the high voltage is not generated. As a result, a transistor which withstands a high voltage is obtained.

In addition, in the channel formation region except the vicinity of the first electrode, the first gate electrode on the side of the first gate insulating layer having large capacitance induces carriers, and thus the channel formation region except the vicinity of the first electrode has sufficient mobility for controlling large electric power. Such a structure makes it possible to provide a transistor which can control large current and withstand a high voltage.

In addition, one embodiment of the present invention is a transistor including a first gate electrode, a first gate insulating layer over the first gate electrode, an oxide semiconductor layer which is provided over the first gate insulating layer and overlaps with the first gate electrode, and a first electrode and a second electrode which are provided in contact with the oxide semiconductor layer and do not overlap with the first gate electrode. The oxide semiconductor layer in a region which is sandwiched between a first region in contact with the first electrode and a second region in contact with the second electrode and does not overlap with the first gate electrode overlaps with a second gate electrode with a second gate insulating layer having smaller capacitance than the first gate insulating layer provided therebetween.

A function as a source electrode and a function as a drain electrode are exchanged between the first electrode and the second electrode depending on the structure and operation conditions of the transistor. Therefore, the channel formation region in the vicinities of the first electrode and the second electrode does not overlap with the first gate electrode and spaces are provided therebetween, whereby the resistance of the channel formation region in the vicinities of the first electrode and the second electrode can be increased. Therefore, even in the operation condition where the function as the source electrode and the function as the drain electrode are switched, the resistance of a region to which a high electric field is applied cam be increased and breakdown of the transistor can be prevented.

One embodiment of the present invention is the transistor in which the second gate insulating layer is formed using a material having the same dielectric constant as the first gate insulating layer, and the second gate insulating layer has a larger thickness than the first gate insulating layer.

In the case where the first gate insulating layer and the second gate insulating layer whose thickness is larger than that of the first gate insulating layer are provided, the use of materials having the same dielectric constant to the first gate insulating layer and the second insulating layer makes it possible to provide a transistor which withstands a high voltage and can control large current.

Further, one embodiment of the present invention is a semiconductor device using the transistor.

Note that the ordinal numbers such as "first" and "second" in this specification are used for convenient differentiation and do not denote the order of steps or the stacking order of layers. In addition, the ordinal numbers in this specification do not denote particular names which specify the present invention.

Note that a gate in this specification refers to the entire gate electrode and gate wiring or part thereof. The gate wiring is a wiring for electrically connecting a gate electrode of at least one transistor to another electrode or another wiring, and includes a scan line in a display device in its category, for example.

The source is the entire source region, source electrode, and source wiring or part thereof. Note that the source region refers to a region overlapping with the source electrode. The source wiring is a wiring for electrically connecting a source electrode of at least one transistor to another electrode or another wiring. For example, in the case where a signal line in a display device is electrically connected to a source electrode, the source wiring includes the signal line in its category.

The drain is the entire drain region, drain electrode, and drain wiring or part thereof. The drain region refers to a region overlapping with the drain electrode. The drain wiring is a wiring for electrically connecting a drain electrode of at least one transistor to another electrode or another wiring. For example, in the case where a signal line in a display device is electrically connected to a drain electrode, the drain wiring includes the signal line in its category.

Accordingly, a transistor which withstands a high voltage and controls large electric power can be provided. Further, a semiconductor device including the transistor can be provided.

BRIEF DESCRIPTION OF THE DRAWINGS

In the accompanying drawings:

FIGS. 7A and 7B each illustrate an electronic device using a semiconductor device according to one embodiment of the present invention;

DETAILED DESCRIPTION OF THE INVENTION

Hereinafter, embodiments and examples of the present invention will be described in detail with reference to the accompanying drawings. Note that the present invention is not limited to the following description, and it is easily understood by those skilled in the art that modes and details of the present invention can be variously changed without departing from the spirit and the scope of the present invention. Therefore, the present invention should not be limited to the descriptions of the embodiments and the examples below.

Embodiment 1

In this embodiment, examples of the structure of a transistor according to one embodiment of the present invention and a method for manufacturing the transistor will be described with reference to FIGS. 1A and 1B, FIGS. 2A to 2E, FIGS. 3A to 3D, and FIGS. 11A and 11B. Note that a first electrode and a second electrode of a transistor are referred to as a drain electrode and a source electrode, respectively in this embodiment.

Figure 1A:
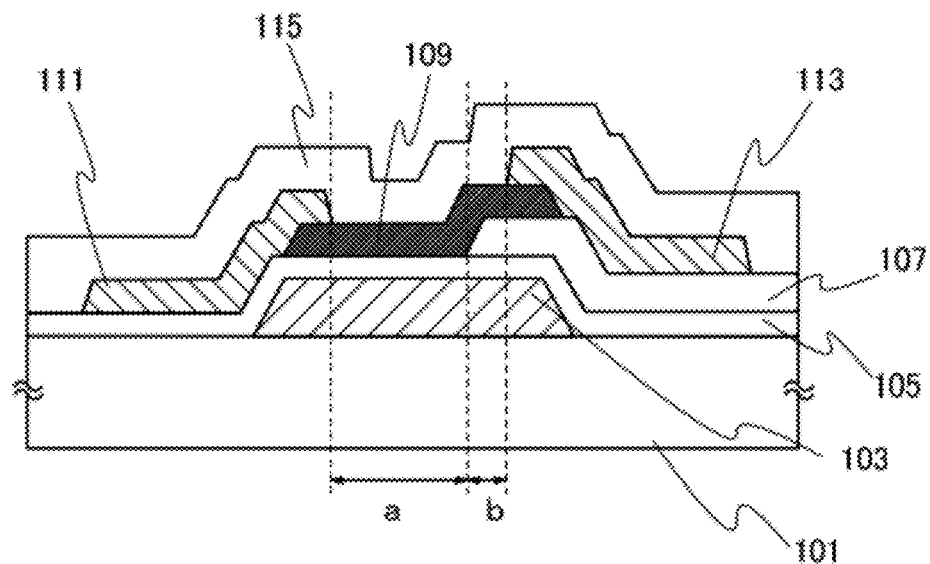
FIGS. 1A and 1B illustrate the structure of a transistor according to one embodiment of the present invention.
Figure 1B:
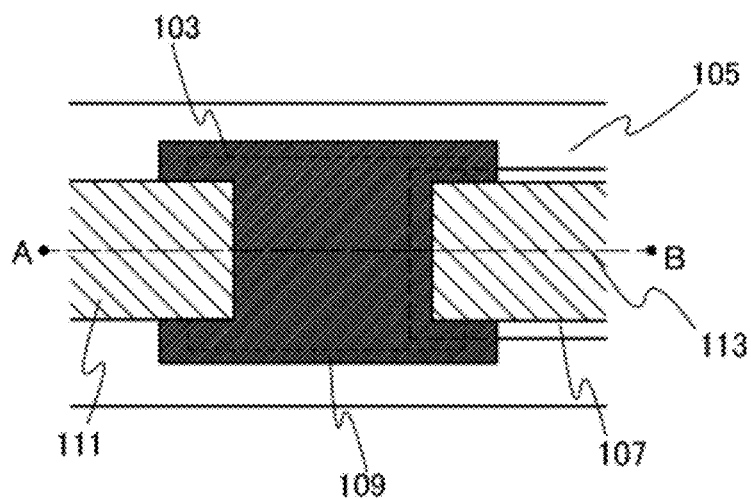

FIGS. 1A and 1B illustrate the structure of a transistor according to one embodiment of the present invention. FIG. 1B is a top view of the transistor according to one embodiment of the present invention, and FIG. 1A is a cross-sectional view taken alone line A-B of the transistor illustrated in FIG. 1B. The transistor illustrated in FIGS. 1A and 1B has a structure in which a second gate insulating layer stacked in the vicinity of a drain is included in addition to a first gate insulating layer, and the thickness of a gate insulating layer is partially increased, whereby the capacitance of the gate insulating layer in the vicinity of the drain is reduced and the resistance of a channel formation region which overlaps with the gate insulating layer in the vicinity of the drain is increased.

In this embodiment, the transistor has a bottom-gate structure in which a gate electrode is provided on a bottom side (a substrate side) with respect to a semiconductor layer in this embodiment. However, the structure of the transistor of one embodiment of the present invention is not particularly limited thereto, and the transistor may have a top-gate structure in which the gate electrode is provided on a top side (a side opposite to the substrate) with respect to the semiconductor layer. In addition, although the transistor in this embodiment has a top-contact structure in which the semiconductor layer is in contact with a source electrode and a drain electrode on the top side (the side opposite to the substrate), the transistor may have a bottom-contact structure in which the semiconductor layer is in contact with the source electrode and the drain electrode on the bottom side (the substrate side).

The transistor illustrated in FIGS. 1A and 1B includes, over a substrate 101 having an insulating surface, a gate electrode 103 having an island shape; a first gate insulating layer 105 which is provided to cover the gate electrode 103; a second gate insulating layer 107 which is provided over the first gate insulating layer 105 and partially overlaps with the gate electrode 103; an oxide semiconductor layer 109 which is provided over the first gate insulating layer 105 and the second gate insulating layer 107 and overlaps with the gate electrode 103; a source electrode 111 which is provided over the oxide semiconductor layer 109 and the first gate insulating layer 105, and whose end portion overlaps with the gate electrode 103; a drain electrode 113 which is provided over the oxide semiconductor layer 109 and the second gate insulating layer 107 and whose end portion overlaps with the gate electrode 103; and an insulating layer 115 covering the first gate insulating layer 105, the second gate insulating layer 107, the oxide semiconductor layer 109, the source electrode 111, and the drain electrode 113. The oxide semiconductor layer 109 overlaps with the gate electrode 103, and includes a channel formation region where a channel is formed in a space between the source electrode 111 and the drain electrode 113 (a region a and a region b in FIG. 1A).

A region of the channel formation region which overlaps with the second gate insulating layer 107 (the region b illustrated in FIG. 1A) is a high resistance region which has higher resistance than the other region (the region a illustrated in FIG. 1A) of the channel formation region. This is because, in the region b, the first gate insulating layer 105 and the second gate insulating layer 107 are stacked, a distance between the oxide semiconductor layer 109 and the gate electrode 103 is increased, and thus the thickness of the gate insulating layer is substantially increased, so that the capacitance is reduced. When the capacitance of the gate insulating layer is reduced, the amount of charge of carriers induced in the channel formation region overlapping with the gate insulating layer is reduced, so that mobility is reduced and resistivity is increased.

One end portion of the region b overlaps with an end portion of the drain electrode, and the other end portion thereof overlaps with the space between the drain electrode and the source electrode. In the region b, the first gate insulating layer 105 and the second gate insulating layer 107 are stacked, whereby the capacitance is reduced. Accordingly, the channel formation region in the region b serves as the high resistance region whose resistance is increased. Since the end portion of the high resistance region overlaps with the drain electrode, even when a high voltage is applied to the drain electrode, a rapid change in the potential does not occur in the vicinity of the drain whose resistivity is high, and a high electric field is not generated. Therefore, since a high electric field is not generated in the transistor of this embodiment even when a high voltage is applied to the drain electrode, the transistor is not easily broken and has high resistance against breakdown.

In addition, the gate insulating layer below the oxide semiconductor layer in the region (the region a) which does not overlap with the second gate insulating layer 107 has a small thickness. One end portion of the region a is in contact with the region b, and the other end portion thereof overlaps with an end portion of the source electrode. The thickness of the gate insulating layer which overlaps with the channel formation region in the region a is small, and thus the channel formation region in the region a serves as a low resistance region whose mobility is high and resistivity is low. Therefore, in the transistor of this embodiment, the channel formation region except the vicinity of the drain has mobility sufficient for controlling large current.

Next, a method for manufacturing the transistor illustrated in FIGS. 1A and 1B is described with reference to FIGS. 2A to 2E and FIGS. 3A to 3D.

Figure 2A:
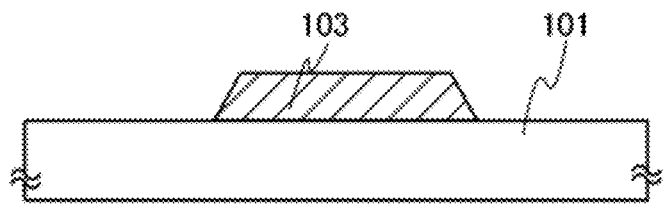
FIGS. 2A to 2E illustrate a method for manufacturing a transistor according to one embodiment of the present invention.

First, a conductive film is formed over the substrate 101 having an insulating surface, and then, the gate electrode 103 is formed through a first photolithography step (see FIG. 2A).

Note that a resist mask may be formed by an inkjet method in any of the photolithography steps in a manufacturing process of the transistor described in this embodiment. When a resist mask is formed by an inkjet method, a photo mask is not used, so that the manufacturing cost can be reduced.

Although there is no particular limitation on the substrate 101, the substrate 101 is preferably a substrate which has barrier properties with respect to impurities including a hydrogen atom (e.g., water vapor, a hydrogen gas, and a hydrogen ion). When heat treatment is performed in a later step, the substrate 101, needs to have heat resistance at least high enough to withstand the heat treatment.

For example, a glass substrate of barium borosilicate glass, aluminoborosilicate glass, or the like, a quartz substrate, a sapphire substrate, or a ceramic substrate can be used. Alternatively, a metal substrate including stainless steel or a semiconductor substrate having an insulating film formed on its surface may be used. There is a tendency that a flexible substrate formed using a synthetic resin such as plastics generally has a lower upper temperature limit than the above substrates; however, such a substrate can be used as long as it can withstand processing temperature in the manufacturing process. Note that a surface of the substrate 101 may be planarized by polishing such as a CMP method.

In this embodiment, a glass substrate is used as the substrate 101.

Note that an insulating layer serving as a base may be provided between the substrate 101 and the gate electrode 103. The insulating layer has a function of preventing diffusion of an impurity element (e.g., an alkali metal such as Li or Na and an alkaline earth metal such as Ca) from the substrate 101, and can be formed with a single-layer structure or a stacked-layer structure including one or more films selected from a silicon nitride film, a silicon oxide film, a silicon nitride oxide film, a silicon oxynitride film, an aluminum oxide film, an aluminum nitride film, an aluminum nitride oxide film, and the like.

Next, the gate electrode 103 is formed. The gate electrode 103 can be formed with a single-layer structure or a stacked-layer structure using a metal material such as molybdenum, titanium, chromium, tantalum, tungsten, neodymium, scandium, or magnesium; an alloy material that contains any of these metals as a main component; or conductive oxide.

Note that aluminum or copper can also be used as the gate electrode 103 as long as it can withstand the temperature of heat treatment to be performed in a later step. Aluminum or copper is preferably used in combination with a refractory metal material in order to avoid problems of heat resistance and corrosion. As the refractory metal material, molybdenum, titanium, chromium, tantalum, tungsten, neodymium, scandium, or the like can be used.

In the case of using copper for the gate electrode 103, a structure in which a Cu—Mg—Al alloy is provided for the layer serving as a base and copper is formed thereover is preferable. The provision of the Cu—Mg—Al alloy has an effect of increasing adhesion between the copper and the base such as an oxide film.

Alternatively, the gate electrode 103 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

In addition, an In—Ga—Zn—O film containing nitrogen, an In—Sn—O film containing nitrogen, an In—Ga—O film containing nitrogen, or a metal nitride film (e.g., InN or ZnN) may be provided as a material layer provided between the gate electrode 103 and the first gate insulating layer 105 formed later to be in contact with the first gate insulating layer 105. These films each have a work function of 5 eV or more, preferably 5.5 eV or more, and allow the threshold voltage of the electric characteristics of the transistor to be positive to make it possible to achieve a so-called normally-off switching element.

For example, in the case where an In—Ga—Zn—O film containing nitrogen is used, an In—Ga—Zn—O film in which the nitrogen concentration higher than at least that of an oxide semiconductor, specifically an In—Ga—Zn—O film in which the nitrogen concentration is higher than or equal to 7 atomic % is used.

Figure 2B:
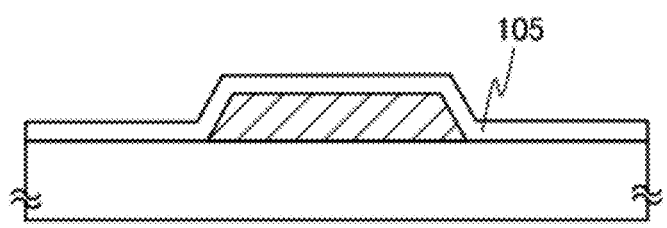

Next, as illustrated in FIG. 2B, the first gate insulating layer 105 is formed over the gate electrode 103. The first gate insulating layer 105 can be formed by a plasma CVD method, a sputtering method, or the like. The first gate insulating layer 105 can be formed with a single-layer or stacked-layer structure using one or more films selected from a silicon oxide film, a silicon nitride film, a silicon oxynitride film, a silicon nitride oxide film, an aluminum oxide film, an aluminum nitride film, an aluminum nitride oxide film, an aluminum oxynitride film, a hafnium oxide film, a tantalum oxide film, a gallium oxide film, and the like. The thickness of the first gate insulating layer is preferably greater than or equal to 30 nm and less than or equal to 300 nm, in particular, greater than or equal to 30 nm and less than or equal to 100 nm.

Figure 2C:
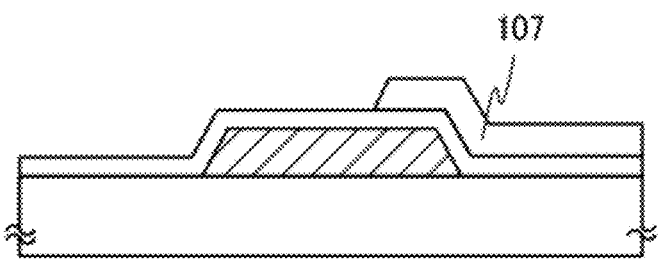

Subsequently, the second gate insulating layer 107 is formed over the first gate insulating layer 105 (see FIG. 2C). The second gate insulating layer 107 can be formed in a such manner that an insulating layer is deposited over the first gate insulating layer 105 by a method similar to that of the first gate insulating layer 105 and is processed into a desired shape using a method such as an etching method or photolithography.

A material of the second gate insulating layer 107 may be the same as or different from the material used for the first gate insulating layer 105. However, it is necessary to appropriately select the material and the thickness of the second gate insulating layer 107 so that when the first gate insulating layer and the second gate insulating layer are stacked, a region where the first gate insulating layer and the second gate insulating layer are staked has smaller capacitance than a region where only the first gate insulating layer is stacked.

In this embodiment, the capacitance of the second gate insulating layer is preferably greater than or equal to 0.1 times and less than or equal to 10 times, further preferably greater than or equal to 0.2 times and less than or equal to 1 time as large as that of the first gate insulating layer. For example, in the case where the first gate insulating layer and the second gate insulating layer are formed using the same materials and the thickness of the first gate insulating layer is 30 nm, the thickness of the second gate insulating layer is preferably greater than or equal to 3 nm and less than or equal to 300 nm, further preferably greater than or equal to 30 nm and less than or equal to 150 nm.

When the first gate insulating layer 105 and the second gate insulating layer 107 are formed using the same material, a film to be the first gate insulating layer and a film to be the second insulating layer are not necessarily formed separately by performing deposition twice. The first gate insulating layer 105 and the second gate insulating layer 107 can be formed in such a manner that a film to be the first gate insulating layer and the second gate insulating layer is deposited at a time and processed into a desired shape (for example, the shape including a region having a large thickness where the first gate insulating layer and the second gate insulating layer are stacked as illustrated in FIG. 2C) using a method such as etching or photolithography.

In this embodiment, the first gate insulating layer 105 and the second gate insulating layer 107 are formed using the same materials.

In addition, as illustrated in FIG. 1B, the second gate insulating layer 107 is preferably provided to surround the drain electrode 113 when seen from the above. When the high resistance region surrounds the drain electrode, not only the resistance of a region in the vicinity of a surface of the drain electrode which is in contact with the channel formation region but also the resistance of a region in the vicinity of a surface orthogonal to the channel formation region can be increased.

As for current of the transistor, there are not only current flowing between surfaces of the source electrode and the drain electrode which face each other through the channel formation region but also a few current flowing through a side of the channel formation region from a surface of the source electrode which does not face the drain electrode. In addition, a high electric field generated from the drain electrode expands concentrically and thus also influences other portions in addition to the channel formation region. Therefore, the second gate insulating layer is provided to surround the drain electrode, whereby breakdown of the transistor due to such current and the change in the electric field can be prevented.

In the channel formation region, the length of the high resistance region in the channel length direction is preferably one third or less of the length of the low resistance region in the channel length direction. When the length of the high resistance region is increased, the mobility of the transistor is largely reduced, which is not suitable for controlling large current. Accordingly, the length of the second gate insulating layer in the channel length direction is preferably 75% or less of the channel length.

Note that the second gate insulating layer may be omitted when it is possible that the capacitance of part of the first gate insulating layer which overlaps with the channel formation region in the vicinity of the drain is small. As a method for reducing the capacitance of the gate insulating layer in the vicinity of the drain, a method in which a material having a low dielectric constant (low-k material) is used for the gate insulating layer in the vicinity of the drain, a method in which the gate insulating layer is subjected to doping so that the capacitance of the gate insulating layer in the vicinity of the drain is reduced, or the like can be given. However, when such methods are used, there is a possibility that leakage current from the gate insulating layer is also increased. Therefore, it is preferable that the capacitance of the gate insulating layer in the vicinity of the drain is controlled by adjusting the dielectric constant and the thickness of the gate insulating layer by providing the second gate insulating layer.

For the oxide semiconductor in this embodiment, an oxide semiconductor that is made to be an i-type semiconductor or a substantially i-type semiconductor by removing impurities (i.e., a highly purified oxide semiconductor) is used. Such a highly purified oxide semiconductor is highly sensitive to an interface state and interface charge; thus, an interface between the oxide semiconductor layer and the gate insulating layer is important. Therefore, the first gate insulating layer 105 and the second gate insulating layer 107 in contact with the highly purified oxide semiconductor need to have higher quality.

For example, a high-density plasma CVD using microwaves (with a frequency of 2.45 GHz, for example) is preferably employed because a dense insulating layer having high withstand voltage and high quality can be formed. This is because when the highly purified oxide semiconductor is closely in contact with the high-quality gate insulating layer, the interface state can be reduced and interface properties can be favorable.

Needless to say, another deposition method such as a sputtering method or a plasma CVD method can be employed as long as a high-quality insulating layer as a gate insulating layer can be formed. Moreover, it is possible to use an insulating layer whose quality and characteristics of an interface with an oxide semiconductor are improved with heat treatment performed after the deposition of the insulating layer. In any case, any insulating layer can be used as long as it can reduce the interface state density between the gate insulating layer and the oxide semiconductor and form a favorable interface as well as having good film quality as the gate insulating layer.

Note that it is preferable that the first gate insulating layer 105 and the second gate insulating layer 107 which are in contact with the oxide semiconductor do not contain hydrogen, a hydroxyl group, and moisture because when hydrogen is dispersed into the oxide semiconductor, the semiconductor characteristics deteriorate. In order that hydrogen, a hydroxyl group, and moisture are contained as little as possible in the first gate insulating layer 105, the second gate insulating layer 107, and the oxide semiconductor layer 109, the substrate 101 over the gate electrode 103 and the first gate insulating layer 105 are formed or the substrate 101 over which components up to the second gate insulating layer 107 are formed is preferably subjected to preheating as pretreatment of deposition of an oxide semiconductor film 108 in a preheating chamber of a sputtering apparatus, so that impurities such as hydrogen and moisture adsorbed on the substrate 101 are removed and exhausted. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted. Further, this preheating may be similarly performed on the substrate 101 over which components up to the source electrode 111 and the drain electrode 113 are already formed, before the formation of the insulating layer 115.

Figure 2D:
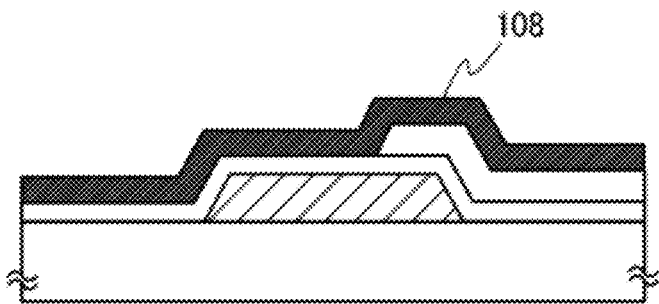
Figure 2E:
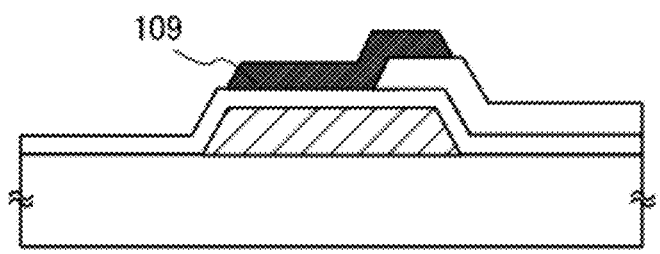

Next, the oxide semiconductor film 108 having a thickness greater than or equal to 2 nm and less than or equal to 200 nm, preferably greater than or equal to 5 nm and less than or equal to 30 nm is formed over the first gate insulating layer 105 and the second gate insulating layer 107 (see FIG. 2D).

The oxide semiconductor used for the semiconductor layer of this embodiment is an oxide semiconductor from which hydrogen that functions as an n-type impurity is removed and which contains impurities except an oxide semiconductor as little as possible.

Note that the oxide semiconductor includes extremely few carriers, and the carrier density is lower than $1\times10^{14}/cm^3$, preferably lower than $1\times10^{12}/cm^3$, further preferably lower than $1\times10^{11}/cm^3$. Such few carriers enable current in an off state (off-state current) to be small enough.

Specifically, in the transistor including the oxide semiconductor, the leakage current density (off-state current density) per micrometer of a channel width between the source electrode and the drain electrode in an off state can be less than or equal to 100 zA/μm ($1\times10^{-19}$ A/μm), preferably less than or equal to 10 zA/μm ($1\times10^{-20}$ A/μm), and further preferably less than or equal to 1 zA/μm ($1\times10^{-21}$ A/μm) at a voltage between the source electrode and the drain electrode of 3.5 eV and at operating temperature (e.g., 25° C.).

In the transistor including the highly purified oxide semiconductor layer, the temperature dependence of on-state current is hardly observed, and the off-state current remains extremely low even at high temperatures.

The oxide semiconductor film 108 is formed by a sputtering method using an oxide semiconductor as a target. When the oxide semiconductor film is formed by a sputtering method, one of an AC sputtering apparatus, a DC sputtering apparatus, and an RF sputtering apparatus is used. Note that a pulse direct current power source is preferable because powder substances (also referred to as particles or dust) generated in deposition can be reduced and the film thickness can be uniform. Moreover, the oxide semiconductor film 108 can be formed by a sputtering method in a rare gas (e.g., argon) atmosphere, an oxygen atmosphere, or a mixed atmosphere including a rare gas (e.g., argon) and oxygen.

Note that before the oxide semiconductor film 108 is formed by a sputtering method, powder substances (also referred to as particles or dust) which are attached on surfaces of the first gate insulating layer 105 and the second gate insulating layer 107 are preferably removed by reverse sputtering in which an argon gas is introduced and plasma is generated. The reverse sputtering refers to a method in which an RF power supply is used for application of voltage to a substrate side in an argon atmosphere and plasma is generated around the substrate to modify a surface. Note that instead of an argon atmosphere, a nitrogen atmosphere, a helium atmosphere, an oxygen atmosphere, or the like may be used.

An oxide semiconductor used for the oxide semiconductor film 108 contains at least one kind of an element selected from In, Ga, Sn, and Zn. For example, an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or an oxide of one metal element, such as an In—O-based oxide semiconductor, a Sn—O-based oxide semiconductor, or a Zn—O-based oxide semiconductor can be used.

Here, for example, an In—Ga—Zn—O-based oxide semiconductor means an oxide film containing indium (In), gallium (Ga), and zinc (Zn), and there is no particular limitation on the composition ratio. The In—Ga—Zn—O-based oxide semiconductor may contain an element other than In, Ga, and Zn. Silicon oxide may be added to any of the above oxide semiconductors.

For the oxide semiconductor film 108, a thin film expressed by the chemical formula of $InMO_3(ZnO)_m$ (m is greater than zero and is not a natural number) can be used. Here, M represents one or more metal elements selected from Ga, Al, Mn, and Co. For example, M may be Ga, Ga and Al, Ga and Mn, Ga and Co, or the like.

The oxide semiconductor film 108 is non-single-crystal and the oxide semiconductor film is not entirely in an amorphous state. Since the oxide semiconductor film is not entirely in an amorphous state, formation of an amorphous portion whose electrical characteristics are unstable is suppressed.

The oxide semiconductor film 108 is preferably an oxide semiconductor containing In, more preferably an oxide semiconductor containing In and Ga. In this embodiment, the oxide semiconductor film 108 is formed by a sputtering method with the use of an In—Ga—Zn—O-based oxide semiconductor target. A cross-sectional view of this stage is shown in FIG. 2D.

The semiconductor film to which nitrogen is added may be used as the semiconductor film. The energy gap is small and carriers easily flow in the oxide semiconductor layer in which nitrogen is intentionally contained as compared to an oxide semiconductor layer in which nitrogen is not intentionally contained.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=1:2 to 10:1 in a molar ratio), more preferably In:Zn=1.5:1 to 15:1 in an atomic ratio ($In_2O_3$:ZnO=3:4 to 15:2 in a molar ratio). For example, in a target used for formation of an In—Zn—O-based oxide semiconductor which has an atomic ratio of In:Zn:O=X:Y:Z, the relation of Z>1.5X+Y is satisfied.

The filling rate of the oxide target is higher than or equal to 90% and lower than or equal to 100%, preferably higher than or equal to 95% and lower than or equal to 99.9%. With use of the metal oxide target with high filling rate, a dense oxide semiconductor film can be formed. Moreover, the purity of the target is preferably higher than or equal to 99.99%, where it is preferable that impurities, for example, an alkali metal such as Li or Na and an alkaline earth metal such as Ca, be particularly reduced.

Moreover, the oxide semiconductor film 108 can be formed by a sputtering method in a rare gas (e.g., argon) atmosphere, an oxygen atmosphere, or a mixed atmosphere including a rare gas (e.g., argon) and oxygen. It is preferable that a high-purity gas from which impurities such as hydrogen, water, hydroxyl, or hydride have been removed be used as a sputtering gas used for forming the oxide semiconductor film. Specifically, a high-purity gas with a dew point of −60° C. or lower is preferable.

Alternatively, a sputtering gas which is heated may be introduced into the deposition chamber. The use of the heated gas makes it possible to reduce the concentration of impurities contained in the oxide semiconductor film 108.

In the case where an oxide semiconductor in which nitrogen is intentionally contained is used, an oxide semiconductor in which nitrogen is intentionally contained may be deposited using a target including an oxide semiconductor and a sputtering gas to which nitrogen is added. Specifically, an In—Ga—Zn—O-based oxide target may be used as a target and one of a nitrogen gas, a rare gas (e.g., an argon gas) to which nitrogen is added, oxygen to which nitrogen is added, or the like may be used as the sputtering gas.

The substrate is placed in a deposition chamber under reduced pressure, and the substrate temperature is set higher than or equal to 100° C. and lower than or equal to 600° C., preferably higher than or equal to 150° C. and lower than or equal to 450° C., more preferably higher than or equal to 200° C. and lower than or equal to 400° C. In particular, the range of higher than or equal to 250° C. and lower than or equal to 320° C. is preferable for dehydrogenation. By forming the oxide semiconductor film in a state where the substrate is heated, the concentration of impurities included in the formed oxide semiconductor film can be reduced. In addition, damage by sputtering can be reduced. Then, a sputtering gas from which hydrogen and moisture are removed is introduced while moisture remaining in the deposition chamber is removed, and the oxide semiconductor film 108 is deposited over the substrate 101 with the use of the target.

In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

In addition, when the deposition chamber is heated at a high temperature, water adsorbed on the chamber can be completely removed.

Moreover, when the leakage rate of the treatment chamber of the sputtering apparatus is set lower than or equal to $1 \times 10^{-10}$ Pa·m$^3$/second, the entry of impurities such as an alkali metal or hydride into the oxide semiconductor film that is being formed by a sputtering method can be reduced. Further, with the use of an entrapment vacuum pump as an evacuation system, counter flow of impurities such as an alkali metal, a hydrogen atom, a hydrogen molecule, water, hydroxyl group, or hydride from the evacuation system can be reduced.

As an example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%).

Note that impurities, for example, an alkali metal such as Li or Na and an alkaline earth metal such as Ca contained in the oxide semiconductor are preferably reduced. Specifically, the concentrations of Li, Na, and K detected by SIMS are each lower than or equal to $5 \times 10^{15}$ cm$^{-3}$, preferably lower than or equal to $1 \times 10^{15}$ cm$^{-3}$.

An alkali metal and an alkaline earth metal are adverse impurities for an oxide semiconductor and are preferably contained little. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage of the transistor to a negative side) or the mobility is decreased). In addition, this also causes variation in the characteristics. Such problems are significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5 \times 10^{19}$ cm$^{-3}$, particularly lower than or equal to $5 \times 10^{18}$ cm$^{-3}$.

Next, the oxide semiconductor film is processed into an island-shaped oxide semiconductor layer through a photolithography step.

In the case where a contact hole is formed in the gate insulating layer, a step of forming the contact hole can be performed at the same time as processing of the oxide semiconductor film.

For the etching of the oxide semiconductor film, wet etching, dry etching, or both of them may be employed. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferable. Alternatively, a gas containing fluorine (for example, a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of the gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) are adjusted as appropriate.

Next, the oxide semiconductor layer is subjected to heat treatment. Dehydration or dehydrogenation of the oxide semiconductor layer can be performed through the heat treatment. The temperature of the heat treatment is higher than or equal to 250° C. and lower than or equal to 750° C., or higher than or equal to 400° C. and less than the strain point of the substrate. For example, the first heat treatment may be performed at 500° C. for longer than or equal to three minutes and shorter than or equal to six minutes. By using a rapid thermal annealing (RTA) method for the heat treatment, dehydration or dehydrogenation can be performed in a short time; therefore, the treatment can be performed even at a temperature of higher than the strain point of a glass substrate.

Here, the substrate is put into an electric furnace which is one of heat treatment apparatuses and heat treatment is performed on the oxide semiconductor layer in a nitrogen atmosphere at 450° C. for one hour. After that, the oxide semiconductor layer is not exposed to air and water and hydrogen are prevented from being mixed into the oxide semiconductor layer again.

Further, a heat treatment apparatus used is not limited to an electric furnace, and a device for heating a process object by heat conduction or heat radiation from a heating element such as a resistance heating element may be alternatively used. For example, an RTA apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object to be processed by heat treatment, such as nitrogen or a rare gas like argon, is used.

For example, the heat treatment can employ GRTA, in which the substrate is moved into an inert gas heated at a high temperature of 650° C. to 700° C., and heated for several minutes there, and then the substrate is moved out of the inert gas.

Note that in the heat treatment, it is preferable that water, hydrogen, and the like are not contained in the atmosphere of nitrogen or a rare gas such as helium, neon, or argon. It is preferable that the purity of nitrogen or the rare gas such as helium, neon, or argon which is introduced into a heat treatment apparatus is set to 6N (99.9999%) or higher, preferably 7N (99.99999%) or higher (that is, the concentration of an impurity is 1 ppm or lower, preferably 0.1 ppm or lower).

In addition, after the oxide semiconductor film is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that the oxygen gas and the $N_2O$ gas do not contain water, hydrogen, and the like. The purity of the oxygen gas or the $N_2O$ gas that is introduced into the heat treatment apparatus is preferably greater than or equal to 6N, more preferably greater than or equal to 7N (i.e., the concentration of impurities in the oxygen gas or the $N_2O$ gas is preferably less than or equal to 1 ppm, more preferably less than or equal to 0.1 ppm). By the effect of the oxygen gas or the $N_2O$ gas, oxygen which is a main component of the oxide semiconductor and which has been reduced at the same time as the step for removing impurities by dehydration or dehydrogenation can be supplied.

The heat treatment of the oxide semiconductor film may be performed on the oxide semiconductor film 108 which has not yet been processed into the island-shaped oxide semiconductor layer 109. In that case, the substrate is taken out of the heat treatment apparatus after the heat treatment; then, a photolithography process is performed thereon.

Note that the heat treatment may be performed at any of the following timings without limitation on the above timing as long as it is performed after deposition of the oxide semiconductor layer: after the source electrode and the drain electrode are formed over the oxide semiconductor layer; and after an insulating layer is formed over the source electrode and the drain electrode.

In addition, heat treatment at a temperature lower than or equal to the glass transition temperature makes it possible to form an oxide semiconductor layer with extremely low carrier density and a wide band gap. Therefore, the transistor can be manufactured using a large-sized substrate, so that the productivity can be increased. In addition, by using the oxide semiconductor in which the hydrogen concentration is reduced and the purity is increased, it is possible to manufacture a transistor with high withstand voltage and extremely low off-state current. The above heat treatment can be performed at any time as long as it is performed after the oxide semiconductor layer is formed.

Further, the oxide semiconductor layer can have a c-axis-aligned crystal structure. Note that in this specification, a layer having a c-axis-aligned crystal structure indicates a layer in which a c-axis of a crystal structure is aligned in a direction substantially vertical to a surface of the oxide semiconductor stacked layer, and which is a non-single-crystal layer. In addition, the oxide semiconductor layer has a plurality of c-axis-aligned crystal structures, and a-b planes or a-axes and b-axes of individual crystals do not correspond to each other.

As a method for making the oxide semiconductor layer have the structures with c-axis alignment, the deposition of the oxide semiconductor layer may be performed in such a manner that the substrate is heated to a temperature at which an oxide semiconductor is c-axis aligned. Such a deposition method makes it possible to provide the crystal structures with c-axis alignment without lengthening the process. The temperature at which the substrate is heated may be appropriately set depending on the other deposition conditions or the structure of the deposition apparatus, and the substrate temperature at which the deposition is performed by the sputtering apparatus is, for example, a temperature higher than or equal to 150° C. and lower than or equal to 450° C., preferably higher than or equal to 250° C.

In addition, as the oxide semiconductor layer, an oxide semiconductor layer having a crystal region which is c-axis-aligned perpendicularly to a surface of the film may be formed by performing deposition twice and heat treatment twice, regardless of material of a base member. For example, a first oxide semiconductor film with a thickness of greater than or equal to 3 nm and less than or equal to 15 nm is formed and then first heat treatment is performed at temperatures higher than or equal to 450° C. and lower than or equal to 850° C., preferably higher than or equal to 550° C. and lower than or equal to 750° C. in an atmosphere of nitrogen, oxygen, a rare gas, or dry air, whereby a first oxide semiconductor film which includes a crystalline region (including plate-like crystals) in a region including its surface is formed. Then, a second oxide semiconductor film which is thicker than the first oxide semiconductor film is formed and then second heat treatment is performed at temperatures higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth, whereby the whole second oxide semiconductor film is crystallized. In such a manner, an oxide semiconductor layer which includes a thick crystalline region may be formed.

Figure 3A:
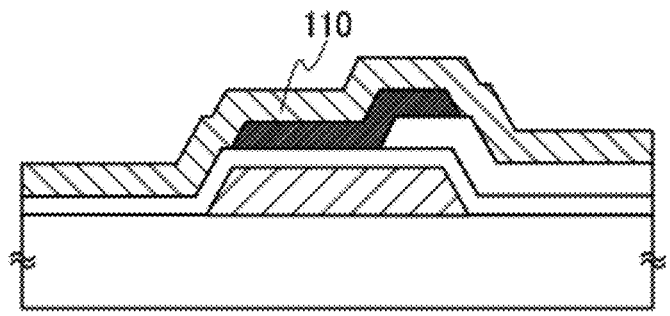
FIGS. 3A to 3D illustrate a method for manufacturing a transistor according to one embodiment of the present invention.

Next, as illustrated in FIG. 3A, a conductive film 110 to be electrode layers serving as the source electrode and the drain electrode (including a wiring formed using the same layer as the conductive film 110) is formed over the first gate insulating layer 105, the second gate insulating layer 107, and the oxide semiconductor layer 109. As the conductive film used for the source electrode and the drain electrode, for example, a metal film including an element selected from Al, Cr, Cu, Ta, Ti, Mo, and W, an alloy or a metal nitride film including any of the above elements as its component (e.g., a titanium nitride film, a molybdenum nitride film, or a tungsten nitride film), or the like can be used. In addition, in order to solve problems caused by poor heat-resistivity and high corrosiveness, a film of a refractory metal such as Ti, Mo, W, Cr, Ta, Nd, Sc, or Y or a metal nitride film thereof (e.g., a titanium nitride film, a molybdenum nitride film, or a tungsten nitride film) may be stacked on one or both of a lower side and an upper side of a metal film of Al, Cu, or the like.

Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given.

Alternatively, the conductive film may be formed using a conductive metal oxide. As the conductive metal oxide, indium oxide, tin oxide, zinc oxide, an indium tin oxide, indium zinc oxide, or the metal oxide material containing silicon or silicon oxide can be used.

Note that in the case where heat treatment is performed after the conductive film is formed, the conductive film preferably has heat resistance high enough to withstand the heat treatment.

Figure 3B:
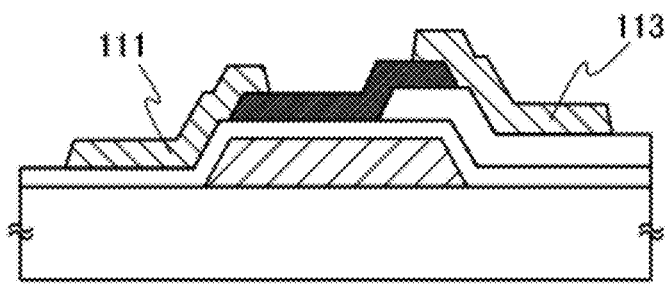

Then, a resist mask is formed over the conductive film through a third photolithography step, and, as illustrated in FIG. 3B, the source electrode 111 and the drain electrode 113 are formed by selective etching, and then, the resist mask is removed.

Note that the end portions of the source electrode and the drain electrode may overlap with the end portions of the gate electrode. Alternatively, a structure may be employed in which the end portions of the source electrode and the drain electrode do not overlap with the end portions of the gate electrode and a region where the oxide semiconductor layer does not overlap with any of the gate electrode, the drain electrode, and the source electrode, i.e., a so-called an offset region is provided.

Light exposure at the time of the formation of the resist mask in the third photolithography step may be performed using ultraviolet light, KrF laser light, or ArF laser light. A channel length L of the transistor to be formed later depends on a distance between a lower end of the source electrode and a lower end of the drain electrode over the oxide semiconductor layer 109. In the case where a channel length L is less than 25 nm, light exposure for formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. Therefore, the channel length L of the transistor to be formed later can be greater than or equal to 10 nm and less than or equal to 1000 nm, and the operation speed of the transistor can be increased.

Note that it is preferable that etching conditions be optimized so that the oxide semiconductor layer 109 is not etched and divided when the conductive film is etched. However, it is difficult to obtain etching conditions in which only the conductive film is etched and the oxide semiconductor layer 109 is not etched at all. In some cases, only part of the oxide semiconductor layer 109 is etched to be an oxide semiconductor layer having a groove (a depression) when the conductive film is etched.

In this embodiment, since the Ti film is used as the conductive film and the In—Ga—Zn—O-based oxide semiconductor is used as the oxide semiconductor layer 109, ammonia hydrogen peroxide (a mixed solution of ammonia, water, and hydrogen peroxide) is used as an etchant for etching the conductive film. When the ammonia hydrogen peroxide mixture is used as an etchant, the conductive film can be selectively etched.

Next, by plasma treatment using a gas such as $N_2O$, $N_2$, or Ar, water or the like adsorbed to a surface of an exposed portion of the oxide semiconductor layer may be removed. Plasma treatment may be performed using a mixture gas of oxygen and argon as well. In the case where the plasma treatment is performed, the insulating layer 115 is formed without exposure to the air as a protective insulating film which is in contact with part of the oxide semiconductor layer (see FIG. 3C).

The insulating layer 115 preferably contains impurities such as moisture, hydrogen, and oxygen as little as possible, and may be formed using a single insulating layer or a stack of a plurality of insulating layers. The insulating layer 115 can be formed to a thickness of at least 1 nm by a method by which impurities such as water or hydrogen are not mixed into the insulating layer 115, such as a sputtering method as appropriate. When hydrogen is contained in the insulating layer 115, there is a concern that entry of the hydrogen to the oxide semiconductor layer or extraction of oxygen in the oxide semiconductor layer by the hydrogen is caused, thereby making the resistance of the back channel of the oxide semiconductor layer low (to have an n-type conductivity), so that a parasitic channel might be formed. Therefore, it is important that a formation method in which hydrogen is not used is employed so that the insulating layer 115 contains hydrogen as little as possible.

The insulating layer 115 is preferably formed using a material having high barrier properties. For example, a silicon nitride film, a silicon nitride oxide film, an aluminum nitride film, an aluminum nitride oxide film, an aluminum oxide film, a gallium oxide film, or the like can be used as the insulating film having high barrier properties. By using the insulating film with high barrier properties, impurities such as moisture or hydrogen can be prevented from entering the island-shaped oxide semiconductor layer, the gate insulating layer, or the interface between the island-shaped oxide semiconductor layer and another insulating layer and the vicinity thereof.

For example, an insulating film having a structure in which an aluminum oxide film having a thickness of 100 nm formed by a sputtering method is stacked over a gallium oxide film having a thickness of 200 nm formed by a sputtering method may be formed. The substrate temperature at the time of deposition is higher than or equal to room temperature and lower than or equal to 300° C. Further, the insulating film preferably contains much oxygen that exceeds the stoichiometric proportion, preferably at a proportion greater than 1 time and less than twice of the stoichiometric proportion. When the insulating film thus contains excessive oxygen, oxygen is supplied to the interface with the island-shaped oxide semiconductor film; thus, oxygen deficiency can be reduced.

In this embodiment, a silicon oxide film with a thickness of 200 nm is formed as the insulating layer 115 by a sputtering method. The substrate temperature in the deposition may be higher than or equal to room temperature and lower than or equal to 300° C. and in this embodiment, is 100° C. The silicon oxide film can be formed by a sputtering method under a rare gas (typically, argon) atmosphere, an oxygen atmosphere, or a mixed atmosphere containing a rare gas and oxygen. As a target, a silicon oxide target or a silicon target may be used. For example, the silicon oxide film can be formed using a silicon target by a sputtering method in an atmosphere containing oxygen. As the insulating layer 115 which is formed in contact with the oxide semiconductor layer, an inorganic insulating film which does not contain an impurity such as moisture, a hydrogen ion, or hydroxyl group and blocks the entry of the impurity from the outside is used. Typically, a silicon oxide film, a silicon oxynitride film, an aluminum oxide film, an aluminum oxynitride film, or the like is used.

As in the case where the oxide semiconductor film 108 is formed, an entrapment vacuum pump (e.g., a cryopump) is preferably used in order to remove moisture remaining in a deposition chamber for the insulating layer 115. The insulating layer 115 is formed in a deposition chamber in which evacuation has been performed with a cryopump, whereby the concentration of impurities in the insulating layer 115 can be reduced. In addition, as an exhaustion unit for removing the residual moisture in the deposition chamber of the insulating layer 115, a turbo pump provided with a cold trap may be used.

It is preferable to use a high-purity gas from which impurities such as hydrogen, water, a hydroxyl group, or hydride are removed as the sputtering gas when the insulating layer 115 is formed. Specifically, a high-purity gas with a dew point of −60° C. or lower is preferable.

After the formation of the insulating layer 115, heat treatment may be performed. The heat treatment is performed in a nitrogen atmosphere, an atmosphere of ultra-dry air, or a rare gas (e.g., argon, helium) atmosphere preferably at a temperature higher than or equal to 200° C. and lower than or equal to 400° C., for example, higher than or equal to 250° C. and lower than or equal to 350° C. It is desirable that the water content in the gas is 20 ppm or less, preferably 1 ppm or less, and more preferably 10 ppb or less. For example, the heat treatment is performed at 250° C. in a nitrogen atmosphere for one hour. Alternatively, RTA treatment may be performed at a high temperature for a short time as in the first heat treatment. Even when oxygen deficiency is generated in the island-shaped oxide semiconductor layer by the heat treatment, by performing heat treatment after the insulating layer 115 containing oxygen is provided, oxygen is supplied to the island-shaped oxide semiconductor layer from the insulating layer 115. By supplying oxygen to the island-shaped oxide semiconductor layer, oxygen deficiency that serves as a donor is reduced in the island-shaped oxide semiconductor layer and the stoichiometric proportion can be satisfied. The island-shaped oxide semiconductor layer preferably contains oxygen whose composition exceeds the stoichiometric composition. As a result, the island-shaped oxide semiconductor layer can be made to be substantially i-type and variation in electric characteristics of the transistor due to oxygen deficiency can be reduced, which results in improvement in electric characteristics. The heat treatment can be performed at any time after the insulating layer 115 is formed. When the heat treatment also serves as another step, the number of steps is not increased.

Moreover, the oxygen deficiency that serves as a donor in the island-shaped oxide semiconductor layer may be reduced by subjecting the island-shaped oxide semiconductor layer to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere does not contain water, hydrogen, or the like. Alternatively, the purity of the oxygen gas which is introduced into the heat treatment apparatus is preferably greater than or equal to 6N (99.9999%) or more preferably greater than or equal to 7N (99.99999%) (that is, the impurity concentration in the oxygen is less than or equal to 1 ppm, or preferably less than or equal to 0.1 ppm).

In this embodiment, the heat treatment (preferably at a temperature higher than or equal to 200° C. and lower than or equal to 400° C., and for example at a temperature higher than or equal to 250° C. and lower than or equal to 350° C.) is performed in an inert gas atmosphere or an oxygen gas atmosphere. For example, the heat treatment is performed at 250° C. in a nitrogen atmosphere for one hour.

Figure 3C:
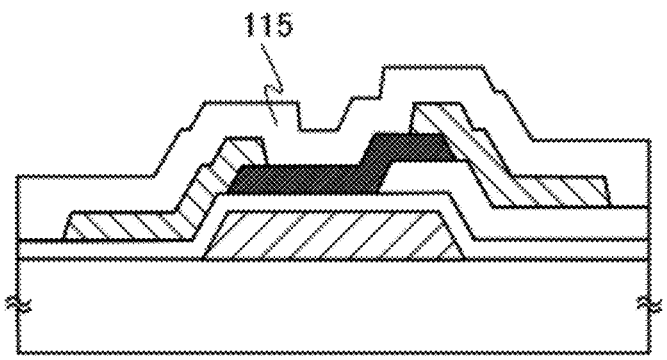

Through the above-described process, the transistor is formed (see FIG. 3C).

Note that when a silicon oxide layer having a lot of defects is used as the insulating layer 115, heat treatment performed after formation of the silicon oxide layer has an effect in diffusing an impurity such as hydrogen, moisture, a hydroxyl group, or hydride contained in the oxide semiconductor layer to the silicon oxide film so that the impurity contained in the oxide semiconductor layer can be further reduced.

In addition, when a silicon oxide film containing excessive oxygen is used as the insulating layer 115, oxygen in the insulating layer 115 is moved to the oxide semiconductor layer 109 by the heat treatment performed after the formation of the insulating layer 115, so that the oxygen concentration in the oxide semiconductor layer 109 can be improved and higher purification can be achieved.

Figure 3D:
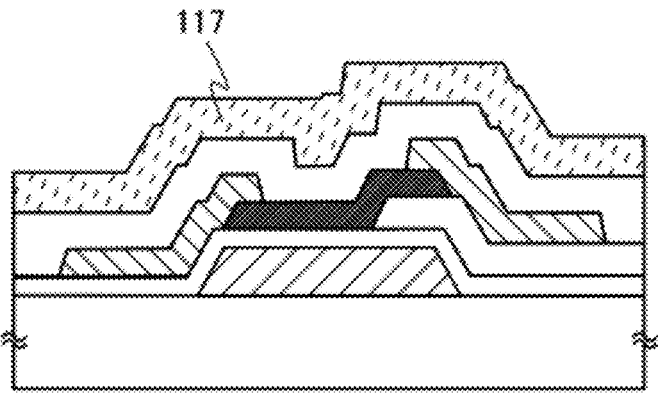

In addition, a protective insulating layer 117 may be stacked over the insulating layer 115 as illustrated in FIG. 3D. For example, a silicon nitride film is formed as the protective insulating layer by an RF sputtering method. An RF sputtering method is preferable as a deposition method of the protective insulating layer 117 because of high productivity. As the protective insulating layer 117, an inorganic insulating film which does not contain an impurity such as moisture and blocks entry of the impurity from the outside, such as a silicon nitride film or an aluminum nitride film, is used. Especially a silicon nitride film and an aluminum nitride film are effective as barrier films against hydrogen ions or hydrogen atoms, and either of these is preferably formed over the insulating layer 115. In this embodiment, the protective insulating layer 117 is formed using a silicon nitride film.

In this embodiment, a silicon nitride film is formed by heating the substrate 101 over which components up to the insulating layer 115 are formed, to a temperature of 100° C. to 400° C., introducing a sputtering gas containing high-purity nitrogen from which hydrogen and moisture are removed, and using a target of a silicon semiconductor. Also in this case, it is preferable that the protective insulating layer 117 is formed while residual moisture in the treatment chamber is removed, in a manner similar to that of the insulating layer 115.

After the formation of the protective insulating layer 117, heat treatment may be further performed at a temperature higher than or equal to 100° C. and lower than or equal to 200° C. in the air for a time longer than or equal to 1 hour and shorter than or equal to 30 hours. This heat treatment may be performed at a fixed heating temperature. Alternatively, the following change in the heating temperature may be performed plural times repeatedly: the heating temperature is increased from room temperature to a temperature higher than or equal to 100° C. and lower than or equal to 200° C. and then decreased to room temperature.

In addition, the oxide semiconductor film 108, the first gate insulating layer 105, and/or the second gate insulating layer 107 may be subjected to oxygen doping treatment. Note that the "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

The oxygen plasma doping treatment may be either a method of adding oxygen which is made to be plasma by inductively coupling plasma (ICP) or a method of adding oxygen which is made to be plasma with the use of a microwave with a frequency of 1 GHz or higher (e.g., a frequency of 2.45 GHz).

Although not illustrated, a planarization insulating layer for planarization may be provided over the protective insulating layer 117. The planarization insulating layer can be formed using a resin material such as polyimide, an acrylic resin, a benzocyclobutene-based resin, polyamide, or an epoxy resin. In addition to such resin materials, it is also possible to use a low-dielectric constant material (low-k material), a siloxane-based resin material, phosphosilicate glass (PSG), borophosphosilicate glass (BPSG), or the like. Note that the planarizing insulating layer may be formed by stacking a plurality of insulating films formed of any of these materials. There is no particular limitation on the method of forming the planarization insulating layer, and any of the followings can be employed depending on the material: a method such as a sputtering method, an SOG method, a spin coating method, a dipping method, a spray coating method, or a droplet discharge method (e.g., an ink-jet method), a printing method (e.g., screen printing, or offset printing), or a tool such as a doctor knife, a roll coater, a curtain coater, or a knife coater.

In the transistor described in this embodiment, a channel formation region is included in a highly purified oxide semiconductor layer and current (off-state current) in an off state is sufficiently small.

Figure 11A:
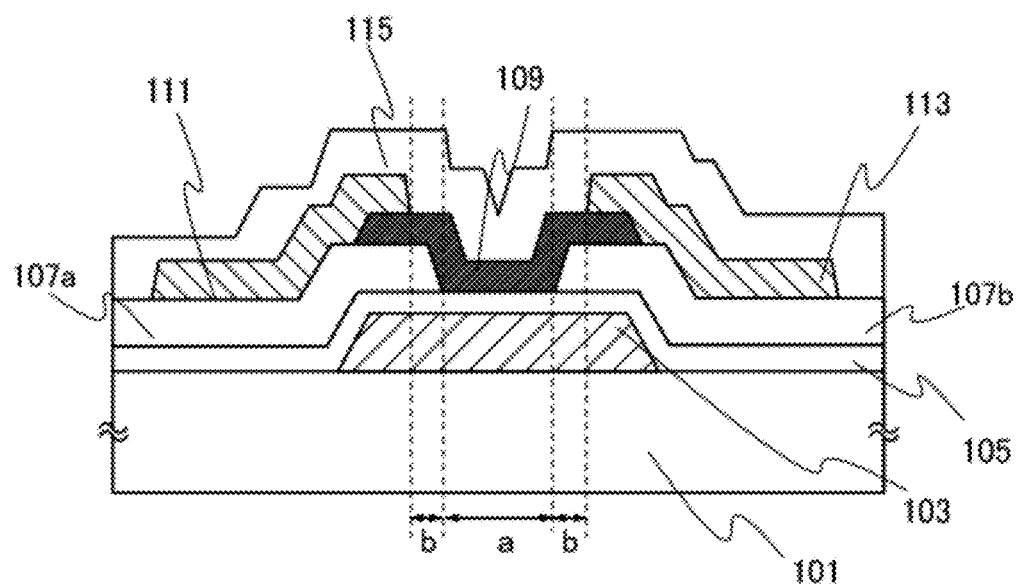
FIGS. 11A and 11B illustrate the structure of a transistor according to one embodiment of the present invention.
Figure 11B:
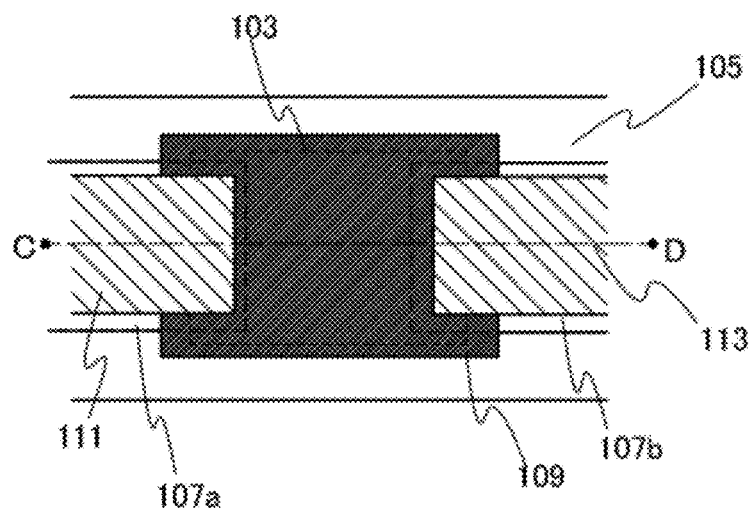

The transistor in which the second gate insulating layer 107 is provided in the vicinity of the drain has been described above. However, the transistor of this embodiment may have another structure, as illustrated in FIGS. 11A and 11B, in which the thickness of the gate insulating layer in the vicinities of the source and the drain is increased and the resistivity of the channel formation region which is in contact with the source electrode and the drain electrode is increased. FIG. 11B is a top view of the transistor in which the thickness of the gate insulating layer in the vicinities of the source and the drain is increased, and FIG. 11A is a cross-sectional view taken along line C-D of FIG. 11B.

The transistor illustrated in FIGS. 11A and 11B includes, over the substrate 101 having an insulating surface, the gate electrode 103 having an island shape; the first gate insulating layer 105 provided to cover the gate electrode 103; a second gate insulating layer 107a and a second gate insulating layer 107b which are provided over the first gate insulating layer 105 and partially overlap with the gate electrode 103; the oxide semiconductor layer 109 which is provided over the first gate insulating layer 105, the second gate insulating layer 107a, and the second gate insulating layer 107b and overlaps with the gate electrode 103; the source electrode 111 which is provided over the oxide semiconductor layer 109 and the second gate insulating layer 107a and whose end portion overlaps with the gate electrode 103; the drain electrode 113 which is provided over the oxide semiconductor layer 109 and the second gate insulating layer 107b, and whose end portion overlaps with the gate electrode 103; and the insulating layer 115 covering the second gate insulating layer 107a, the second gate insulating layer 107b, the oxide semiconductor layer 109, the source electrode 111, and the drain electrode 113. A region in the oxide semiconductor layer 109 which overlaps with the gate electrode 103 and is in a space between the source electrode 111 and the drain electrode 113 serves as a channel formation region.

In the transistor illustrated in FIGS. 11A and 11B, regions (regions b in FIGS. 11A and 11B) of the gate insulating layer below the channel formation region which overlaps with the second gate insulating layer 107a and the second gate insulating layer 107b each have a larger thickness than the other region (a region a in FIGS. 11A and 11B) of the gate insulating layer below the channel formation region, and thus, the region b is a high resistance region whose resistivity is higher than that of the region a.

Although the first electrode and the second electrode of the transistor are referred to as the drain electrode and the source electrode, respectively in this embodiment, a function as the source electrode and a function as the drain electrode are exchanged between the first electrode and the second electrode depending on the structure and operation conditions of the transistor. Thus, as illustrated in FIGS. 11A and 11B, the second gate insulating layer 107a and the second gate insulating layer 107b are provided and the high resistance regions are provided in the channel formation region in the vicinities of the source and the drain, whereby a high electric field can be relaxed and the breakdown of the transistor can be prevented irrespective of whether the first electrode (the second electrode) functions as the source electrode or functions as the drain electrode.

As described above, in the transistor of this embodiment, the capacitance of the gate insulating layer which overlaps with the channel formation region in the vicinities of the drain and the source and the drain is reduced to form the high resistance regions. As a result, the transistor which withstands a high voltage and in which a high electric field is prevented from being generated in the vicinity of the drain even when a high voltage is applied to the drain electrode can be provided.

Further, the mobility of the transistor in this embodiment is not reduced because the thickness of the gate insulating layer except the regions which are in the vicinities of the source and the drain remains small. As a result, the resistance of the transistor against breakdown can be increased while keeping mobility sufficient for controlling large current.

Accordingly, the transistor of this embodiment can be the transistor that withstands a high voltage and controls large electric power.

This embodiment can be freely combined with any of the other embodiments in this specification.

Embodiment 2

Figure 4A:
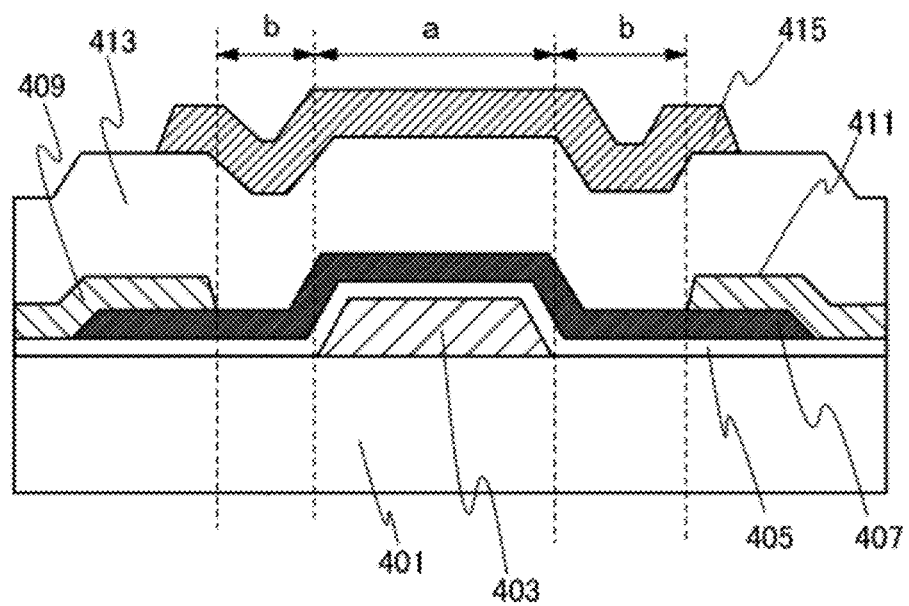
FIGS. 4A and 4B each illustrate the structure of a transistor according to one embodiment of the present invention.
Figure 4B:
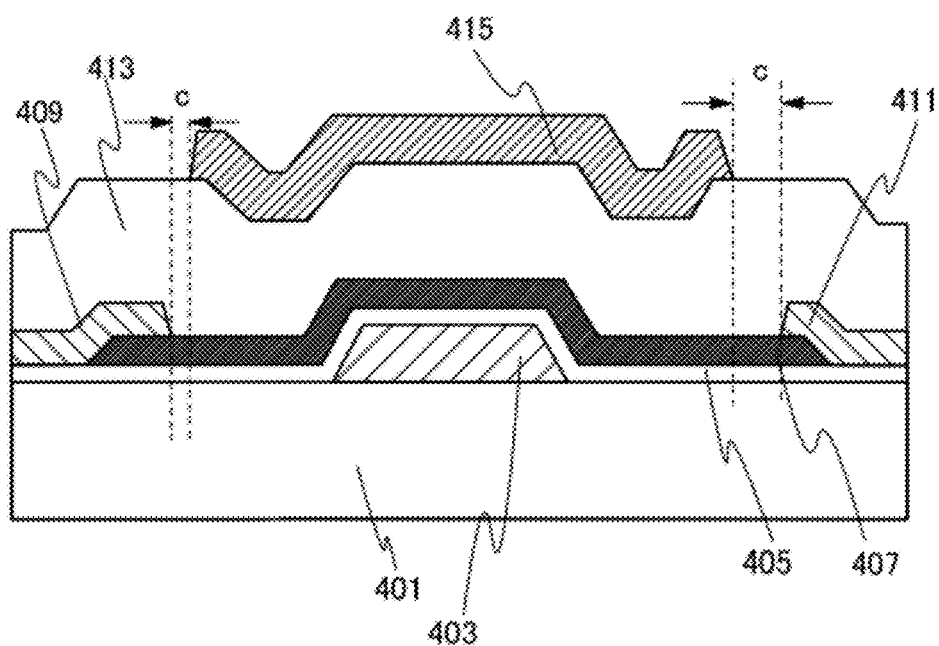

In this embodiment, transistors according to one embodiment of the present invention which are different from those of Embodiment 1 will be described. FIGS. 4A and 4B each illustrate a transistor of this embodiment. Note that a first electrode and a second electrode of a transistor are referred to as a drain electrode and a source electrode, respectively in this embodiment.

A transistor of one embodiment of the present invention includes, as illustrated in FIG. 4A, a substrate 401; an island-shaped first gate electrode 403 provided over the substrate 401; a first gate insulating layer 405 provided to cover the first gate electrode 403; an oxide semiconductor layer 407 which is provided over the first gate insulating layer 405 to overlap with the first gate electrode 403 and whose length in a channel length direction is longer than that of the first gate electrode 403; a pair of a source electrode 409 and a drain electrode 411 whose end portions overlap with the oxide semiconductor layer 407; a second gate insulating layer 413 covering the oxide semiconductor layer 407, the source electrode 409, and the drain electrode 411; and a second gate electrode 415 which is provided over the second gate insulating layer 413 to overlap with the oxide semiconductor layer 407 and whose end portions overlap with the source electrode 409 and the drain electrode 411. A channel formation region is formed in part of the oxide semiconductor layer 407 which overlaps with at least one of the first gate electrode 403 and the second gate electrode 415 and is in a space between the source electrode 409 and the drain electrode 411.

The source electrode and the drain electrode do not overlap with the first gate electrode, and spaces are provided between the source electrode and the first gate electrode and between the drain electrode and the first gate electrode. In each of the spaces, the oxide semiconductor layer and the second gate electrode overlap with each other.

The capacitance of the second gate insulating layer 413 is smaller than that of the first gate insulating layer 405. Therefore, the first gate electrode 403 which is provided below the channel formation region with the first gate insulating layer 405 having large capacitance provided therebetween mainly induces carriers in a region (a region a in FIG. 4A) of the channel formation region which overlaps with both of the first gate electrode 403 and the second gate electrode 415.

Since the first gate electrode 403 overlaps with the channel formation region with the first gate insulating layer having large capacitance provided therebetween, the channel formation region in the region a is a low resistance region which has high mobility and low resistivity.

Regions (regions b in FIG. 4A) of the channel formation region in the vicinities of the source and the drain overlap with the second gate electrode 415 but do not overlap with the first gate electrode 403. Therefore, the second gate electrode 415 induces carriers in the regions b.

In the regions b, since the second gate electrode 415 overlaps with the channel formation region with the second gate insulating layer 413 having small capacitance provided therebetween, the regions b of the channel formation region are high resistance regions having low mobility and high resistivity.

In this embodiment, since the regions in the channel formation region in the vicinities of the source and the drain are the high resistance regions having high resistivity, an electric field in the vicinity of the drain is not rapidly changed even when a high voltage is applied to the drain electrode. Accordingly, even when a high voltage is applied to the transistor, the breakdown of the transistor does not easily occur and the transistor has high resistance against breakdown.

In addition, in the low resistance region which is the channel formation region except the regions in the vicinities of the source and the drain, a reduction in mobility does not occur, and thus sufficient mobility for controlling large current can be kept in the low resistance region and the resistance of the transistor against breakdown can be increased.

Accordingly, as the transistor of this embodiment, a transistor which withstands a high voltage and controls large electric power can be provided.

The transistor of this embodiment can be manufactured using the same material and method as those of the transistor described in Embodiment 1.

Note that the transistor in this embodiment needs to be manufactured so that the capacitance of the second gate insulating layer 413 is smaller than that of the first gate insulating layer 405. In the transistor of this embodiment, it is preferable that the capacitance of the second gate insulating layer is greater than or equal to 0.1 times and less than 1 time, further preferably greater than or equal to 0.15 times and less than 0.5 times the capacitance of the first gate insulating layer. The capacitance of the gate insulating layer is determined depending on the original dielectric constant of a material used for the gate insulating layer, the thickness of the gate insulating layer, and the like. Thus, these conditions may be set appropriately so that the capacitance of the second gate insulating layer 413 is smaller than that of the first gate insulating layer 405.

In the transistor described in this embodiment, the first gate insulating layer 405 and the second gate insulating layer 413 are formed using the same material. When the same material is used, the first gate insulating layer 405 and the second gate insulating layer 413 have the same dielectric constant. Therefore, the thickness of the first gate insulating layer is set so as to be smaller than that of the second gate insulating layer, whereby the capacitance of the second gate insulating layer can be smaller than that of the first gate insulating layer.

A method for making the capacitance of the second gate insulating layer smaller than that of the first gate insulating layer is not limited to the above method. For example, a method in which a material having a small dielectric constant is used for the second gate insulating layer, a method in which doping is performed so that the capacitance of the second gate insulating layer becomes small, or the like is appropriately used, whereby the capacitances may be set appropriately so that the capacitance of the second gate insulating layer is smaller than that of the first gate insulating layer.

Although the spaces are provided between the first gate electrode and the source electrode and between the first gate electrode and the drain electrode, spaces are not needed on the both side in the transistor of the present invention, and a space may be provided on one side.

Further, in the transistor of this embodiment, regions (offset regions, regions c in FIG. 4B) of the channel formation region which overlap with neither the first gate electrode 403 nor the second gate electrode 415 may be provided as illustrated in FIG. 4B. The offset regions do not overlap with any of the gate electrodes and thus are regions which have higher mobility and lower resistivity than the region a and the regions b. The regions c which have higher resistivity than the region a and the regions b are provided in the channel formation region, whereby a change in a potential from the channel formation region to the drain electrode is further reduced and a high electric field generated in the vicinity of the drain can be relaxed.

The offset region may be provided in only in a region in the vicinity of the drain or in each of regions in the vicinities of the source and the drain. In addition, the length of the offset region in the vicinity of the drain in the channel length direction may be larger than the length of the offset region in the vicinity of the source in the channel length direction. However, when the length of the offset region is too large, there is a possibility that current does not flow between the source electrode and the drain electrode. Therefore, the length of the offset region in the channel length direction is preferably less than or equal to 10% of the channel length.

As described above, in the transistor described in this embodiment, carriers are induced by the second gate electrode which is provided over the channel formation region with the second gate insulating layer having small capacitance provided therebetween, whereby the resistance of the channel formation region in the vicinities of the source and the drain is increased. Therefore, even when a high voltage is applied to the drain electrode, a high electric field is not generated, so that the transistor having high resistance against breakdown can be provided.

In addition, in the portion of the channel formation region except the portions in the vicinities of the source and the drain, carriers are induced by the gate electrode which is provided below the channel formation region with the first gate insulating layer having large capacitance provided therebetween. As a result, the transistor having sufficient mobility for controlling large current can be provided.

This embodiment can be freely combined with any of the other embodiments in this specification.

Embodiment 3

In this embodiment, examples of a semiconductor device using the transistor described the above embodiment will be described. For example, a circuit which converts DC voltage at a given value into DC voltage at another value (also referred to as a DC converter circuit or a DC-DC converter) can be used in the case where power supply voltage at a stable value is generated from voltage with large fluctuation or in the case where power supply voltage at a plurality of different values is needed. The transistor described in the above embodiment is a transistor with improved withstand voltage; therefore, a highly reliable DC converter circuit can be formed using the transistor.

Further, the DC converter circuit in which the transistor is used can form a power supply circuit by combining with a variety of power storage devices. In this embodiment, a power supply circuit including the transistor described in the above embodiment will be described.

Figure 5:
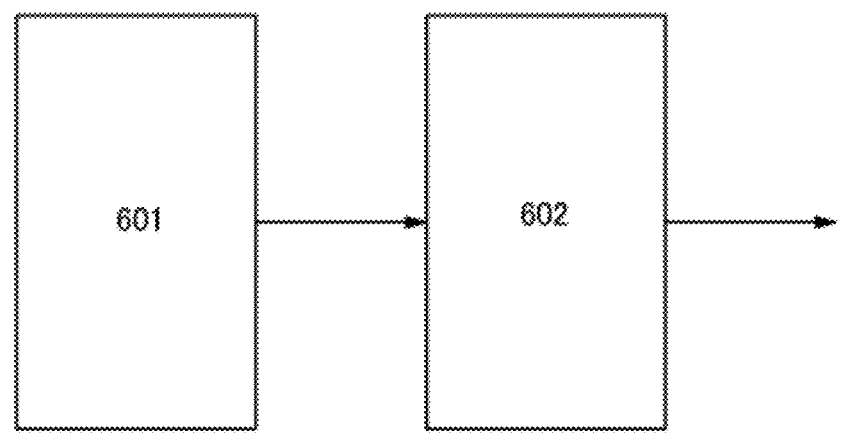
FIG. 5 illustrates a semiconductor device according to one embodiment of the present invention.

An example of a configuration of the power supply circuit in this embodiment will be described with reference to FIG. 5. FIG. 5 is a block diagram illustrating an example of the configuration of the power supply circuit in this embodiment.

The power supply circuit illustrated in FIG. 5 includes a power storage device 601 and a DC converter circuit 602.

The power storage device 601 has a function of supplying electric power. As the power storage device 601, for example, one or more of a photoelectric conversion device, a lithium ion secondary battery, a lithium ion capacitor, an electric double-layer capacitor, and a redox capacitor can be used. For example, the combination of a lithium ion secondary battery and a lithium ion capacitor can be a power storage device capable of high-speed charging and discharging and of supplying electric power for a long time. The power storage device 601 is not limited to the lithium ion secondary battery. For the power storage device 601, a secondary battery in which another alkali metal ion, alkaline earth metal ion, or the like is used as a mobile ion may be used. In addition, the power storage device 601 is not limited to the lithium ion capacitor. For the power storage device 601, a capacitor in which another alkali metal ion, alkaline earth metal ion, or the like is used as a mobile ion may be used.

Figure 6A:
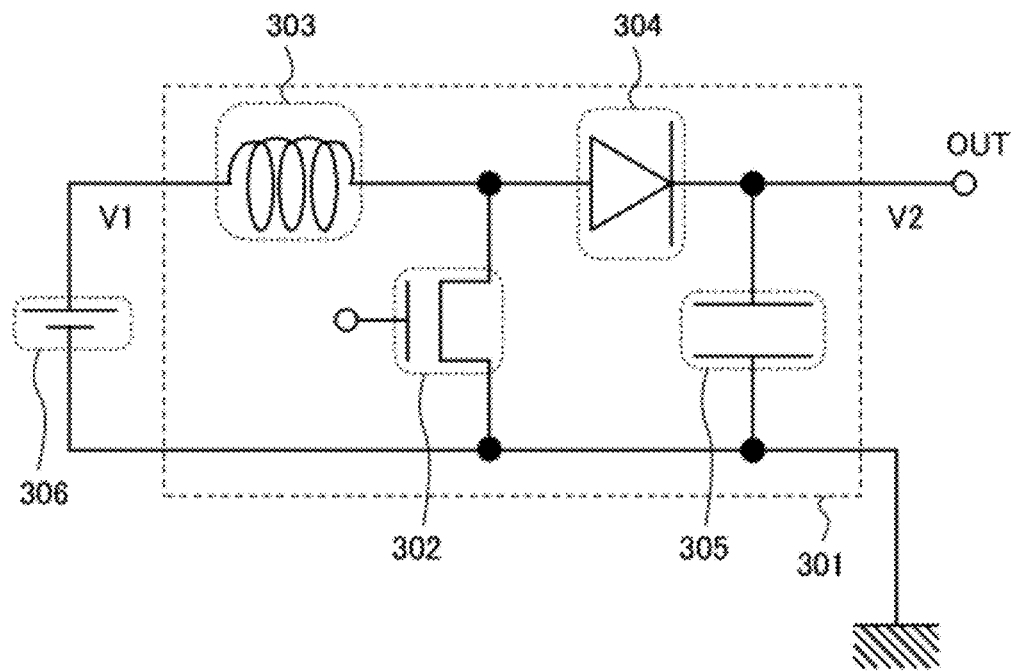
FIGS. 6A and 6B each illustrate a semiconductor device according to one embodiment of the present invention.
Figure 6B:
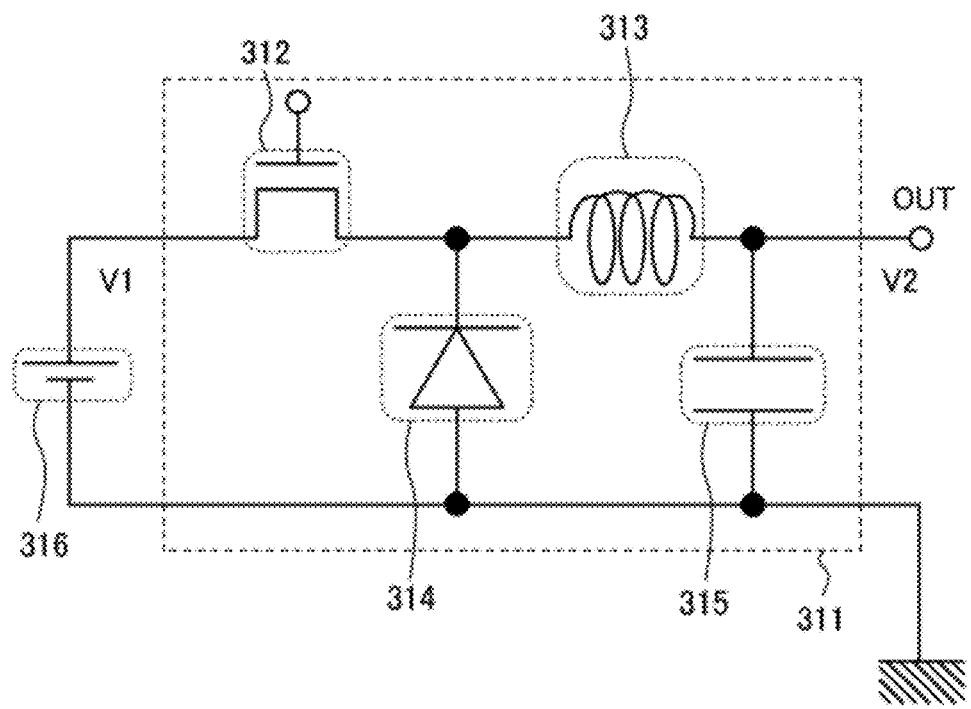

As the DC converter circuit 602, for example, any of circuits illustrated in FIGS. 6A and 6B can be used. A DC converter circuit 301 illustrated in FIG. 6A is a step-up circuit which includes a transistor 302, a coil 303, a diode 304, a capacitor 305, and a DC power supply 306.

One terminal of the coil 303 is electrically connected to an anode of the DC power supply 306. The other terminal of the coil 303 is electrically connected to one of a source and a drain of the transistor 302. The other of the source and the drain of the transistor 302 is electrically connected to a cathode of the DC power supply 306 and one terminal of the capacitor 305. The other terminal of the capacitor 305 is electrically connected to an output terminal of the diode 304 and an output terminal OUT. Note that the cathode of the DC power supply 306, the other of the source and the drain of the transistor 302, and the one terminal of the capacitor 305 are grounded.

The transistor 302 functions as a switching element. In addition, a gate of the transistor 302 is connected to a control circuit of DC convertor circuit 301. The transistor 302 is turned on and off by a signal output from the control circuit of the DC converter circuit 301.

When the transistor 302 functioning as a switching element is on, excitation energy is accumulated in the coil 303 by current flowing to the coil 303.

When the transistor 302 is off, excitation energy accumulated in the coil 303 is released. A voltage V2 due to excitation energy released from the coil 303 is added to a voltage V1. Thus, the DC convertor circuit 301 functions as a step-up circuit.

The longer the period in which the transistor 302 is on becomes and the larger energy accumulated in the coil 303 becomes, the larger electric power to be obtained becomes.

A DC convertor circuit 311 illustrated in FIG. 6B is a step-down circuit which includes a transistor 312, a coil 313, a diode 314, and a capacitor 315.

One of a source and a drain of the transistor 312 is electrically connected to an anode of a DC power supply 316. The other of the source and the drain of the transistor 312 is electrically connected to an output terminal of the diode 314 and one terminal of the coil 313. An input terminal of the diode 314 is electrically connected to a cathode of the DC power supply 316 and one terminal of the capacitor 315. The output terminal of the diode 314 is electrically connected to the other of the source and the drain of the transistor 312 and the one terminal of the coil 313. The one terminal of the coil 313 is electrically connected to the other of the source and the drain of the transistor 312 and the output terminal of the diode 314. The other terminal of the coil 313 is electrically connected to the other terminal of the capacitor 315 and the output terminal OUT. Note that the cathode of the DC power supply 316, the input terminal of the diode 314, and the one terminal of the capacitor 315 are grounded.

The transistor 312 functions as a switching element. In addition, a gate of the transistor 312 is connected to a control circuit of the DC convertor circuit 311. The transistor 312 is turned on and off by a signal output from the control circuit of the DC converter circuit 311.

When the transistor 312 which is a switching element is on, excitation energy is accumulated in the coil 313 by current flowing from the input to the output of the step-down circuit.

When the transistor 312 is turned off, the coil 313 generates electromotive force to keep current flowing, so that the diode 314 is turned on. Current flows through the diode 314, and the voltage is decreased to be V2. The level of the voltage V2 becomes lower than that of the voltage V1; thus, the DC convertor circuit 311 functions as a step-down circuit. Note that in this embodiment, a field effect transistor can be used as the transistor 312, for example.

Further, in this embodiment, a wiring formed over a substrate to have a coil shape may be used as the coil 303 and the coil 313

In this embodiment, a Schottky-barrier diode can be used as the diode 304 and the diode 314, for example.

In this embodiment, a capacitor including a first electrode, a second electrode, and a dielectric can be used as the capacitor 305 and the capacitor 315, for example.

Note that in this embodiment, a transistor described in Embodiment 1 or 2 can be used as the transistor 302 or a transistor 312, for example.

The transistor described in one embodiment of the present invention has a characteristic of capability for withstanding a high voltage and controlling large current since the semiconductor layer includes an oxide semiconductor. Therefore, the use of the transistor in the voltage conversion circuit described in this embodiment makes it possible to manufacture a circuit capable of driving with large current.

As illustrated in FIG. 5, an example of the power supply circuit of this embodiment includes a power storage device and a DC converter circuit. Electric power supplied by the power storage device is raised or lowered by the DC converter circuit, whereby power supply voltage which is suitable for the specification of the device to which electric power is supplied is generated. Further, the transistor described in the above embodiment is used as part of the DC converter circuit in the power supply circuit of this embodiment, so that reliability of the power supply circuit can be increased.

Note that this embodiment can be combined with any of the other embodiments as appropriate.

Embodiment 4

In this embodiment, examples of an electronic device to which the power supply circuit according to Embodiment 3 can be applied will be described with reference to FIGS. 7A and 7B.

FIG. 7A illustrates a laptop personal computer, which includes a main body 3001, a housing 3002, a display portion 3003, a keyboard 3004, and the like. The power supply circuit described in Embodiment 3 can be used to generate power supply voltage which is supplied to the laptop personal computer illustrated in FIG. 7A.

FIG. 7B illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging of the portable information terminal, an external memory slot 2811, and the like. Further, an antenna is incorporated in the housing 2801.

The display panel 2802 is provided with a touch panel. A plurality of operation keys 2805 which are displayed as images is illustrated by dashed lines in FIG. 7B.

The mobile phone illustrated in FIG. 7B includes a power supply circuit including the solar battery cell 2810 and a DC converter circuit which converts voltage which is output from the solar battery cell 2810 into voltage which is necessary for each circuit.

In this manner, the power supply circuit in Embodiment 3 can be applied to a variety of electronic devices, so that a highly reliable electronic device can be provided.

This embodiment can be combined with any of the other embodiments as appropriate.

Embodiment 5

In this embodiment, an oxide semiconductor which can be used in one embodiment of the present invention will be described.

The oxide semiconductor preferably contains at least indium (In) or zinc (Zn). In particular, In and Zn are preferably contained.

As a stabilizer for reducing variation in electric characteristics of a transistor including the oxide semiconductor containing indium (In) or zinc (Zn), it is preferable that one or more selected from gallium (Ga), tin (Sn), hafnium (Hf), aluminum (Al), or lanthanoid are contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used.

Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that the amorphous structure has many defects; therefore, a non-amorphous structure is preferred.

The contents of this embodiment or part thereof can be implemented in combination with any of the other embodiments and examples.

Embodiment 6

In this embodiment, a favorable crystal state included in the oxide semiconductor described in Embodiment 5 will be described.

In this embodiment, a CAAC-OS (c-axis aligned crystalline oxide semiconductor) film which has an amorphous portion and a crystalline portion where crystals are aligned in the c-axis direction will be described.

The CAAC-OS film is a novel oxide semiconductor film.

The CAAC-OS film is not completely single crystal nor completely amorphous. The CAAC-OS film is an oxide semiconductor film with a crystal-amorphous mixed phase structure where crystal portions and amorphous portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the directions of the b-axis may be different from those of another crystal portion. In this specification, a simple term "perpendicular" includes a range from 85° to 95°. In addition, a simple term "parallel" includes a range of from −5° to 5°.

In the CAAC-OS film, distribution of crystal portions in the film is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity element is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal portion is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With use of the CAAC-OS film, change in electric characteristics of the transistor due to irradiation with visible light or ultraviolet light can be reduced, so that the highly reliable transistor can be obtained.

Note that part of oxygen included in the oxide semiconductor film may be substituted with nitrogen.

An example of a crystal structure of a CAAC-OS will be described with reference to FIGS. 12A to 12E, FIGS. 13A to 13C, and FIGS. 14A to 14C.

In FIGS. 12A to 12E, FIGS. 13A to 13C, and FIGS. 14A to 14C, the vertical direction corresponds to the c-axis direction and a plane perpendicular to the c-axis direction corresponds to the a-b plane.

In this embodiment, the expressions of an "upper half" and a "lower half" refer to an upper half above the a-b plane and a lower half below the a-b plane, respectively.

Figure 12A:
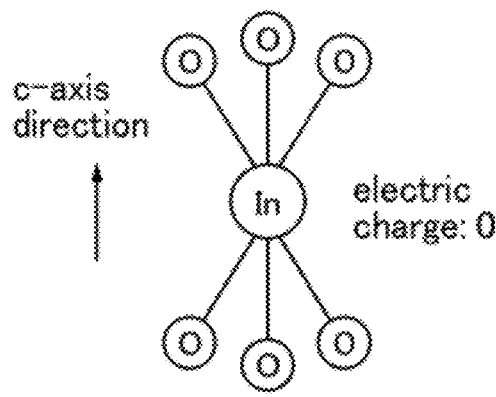
FIGS. 12A to 12E illustrate examples of an oxide semiconductor.

FIG. 12A illustrates a structure A including one hexacoordinate In atom and six tetracoordinate oxygen (hereinafter referred to as tetracoordinate O) atoms proximate to the In atom.

Here, a structure including one metal atom and oxygen atoms proximate thereto is referred to as a small group.

The structure A is actually an octahedral structure, but is illustrated as a planar structure for simplicity.

Note that in the structure A, three tetracoordinate O atoms exist in each of an upper half and a lower half In the small group in the structure A, electric charge is 0.

Figure 12D:
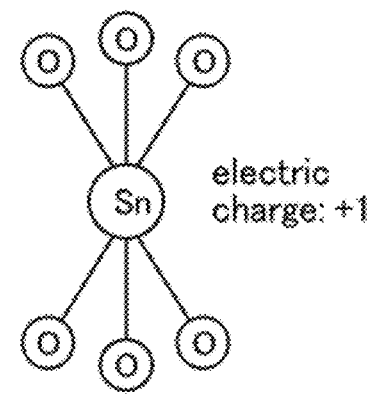
Figure 12B:
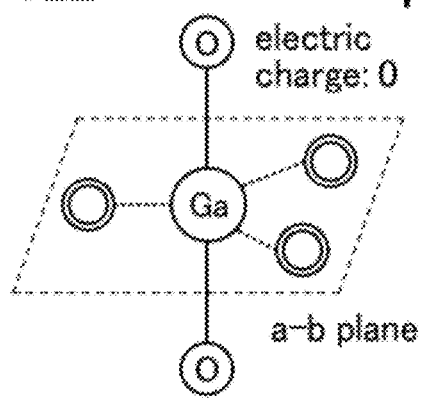

FIG. 12B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the tricoordinate O atoms exist on the a-b plane. In the structure B, one tetracoordinate O atom exists in each of an upper half and a lower half.

An In atom can also have the structure B because an In atom can have five ligands. In the small group in the structure B, electric charge is 0.

Figure 12E:
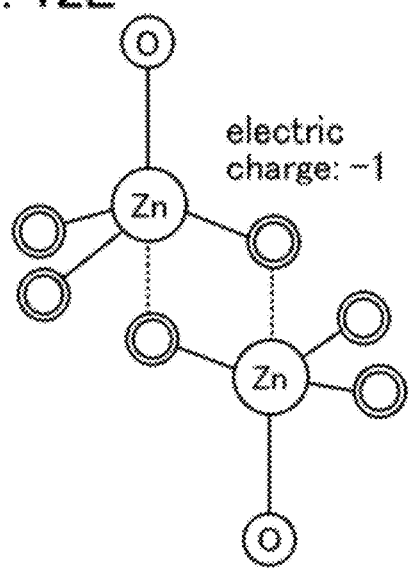
Figure 12C:
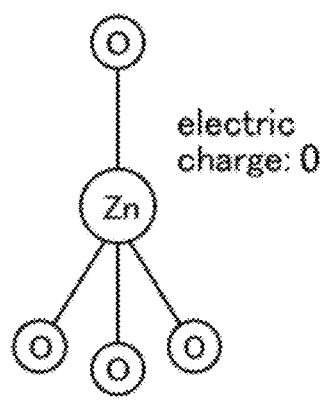

FIG. 12C illustrates a structure C including one tetracoordinate Zn atom and four tetracoordinate O atoms proximate to the Zn atom.

In the structure C, one tetracoordinate O atom exists in an upper half and three tetracoordinate O atoms exist in a lower half. In the small group in the structure C, electric charge is 0.

FIG. 12D illustrates a structure D including one hexacoordinate Sn atom and six tetracoordinate O atoms proximate to the Sn atom.

In the structure D, three tetracoordinate O atoms exist in each of an upper half and a lower half.

In the small group in the structure D, electric charge is +1.

FIG. 12E illustrates a structure E including two Zn atoms.

In the structure E, one tetracoordinate O atom exists in each of an upper half and a lower half. In the small group in the structure E, electric charge is −1.

In this embodiment, a plurality of small groups form a medium group, and a plurality of medium groups form a large group (also referred to as a unit cell).

Now, a rule of bonding between the small groups will be described.

The three O atoms in the upper half with respect to the In atom each have three proximate In atoms in the downward direction, and the three O atoms in the lower half each have three proximate In atoms in the upward direction.

The one O atom in the upper half with respect to the Ga atom has one proximate Ga atom in the downward direction, and the one O atom in the lower half has one proximate Ga atom in the upward direction.

The one O atom in the upper half with respect to the Zn atom has one proximate Zn atom in the downward direction, and the three O atoms in the lower half each have three proximate Zn atoms in the upward direction.

In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4.

Therefore, when the sum of the number of tetracoordinate O atoms above a metal atom and the number of tetracoordinate O atoms below another metal atom is 4, the two kinds of small groups including the metal atoms can be bonded.

This is because in the case, for example, where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition to the above, a medium group can be formed in a different manner by combining a plurality of small groups so that the total electric charge of the layered structure is 0.

Figure 13A:
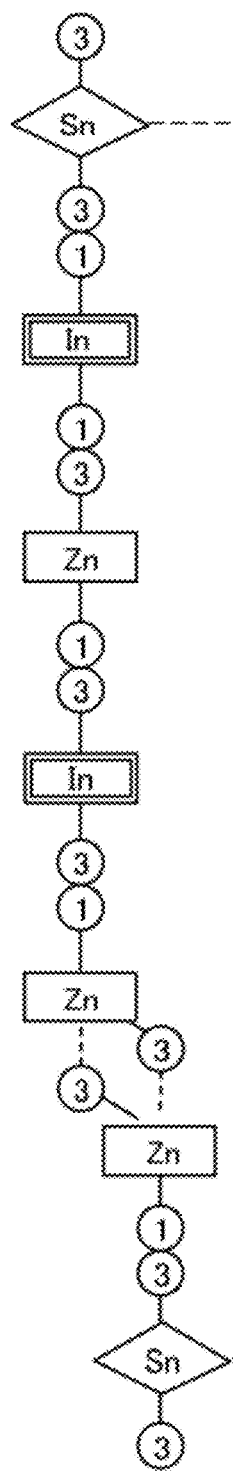
FIGS. 13A to 13C illustrate an example of an oxide semiconductor.

FIG. 13A illustrates a model of a medium group A included in a layered structure of an In—Sn—Zn—O-based material.

Figure 13B:
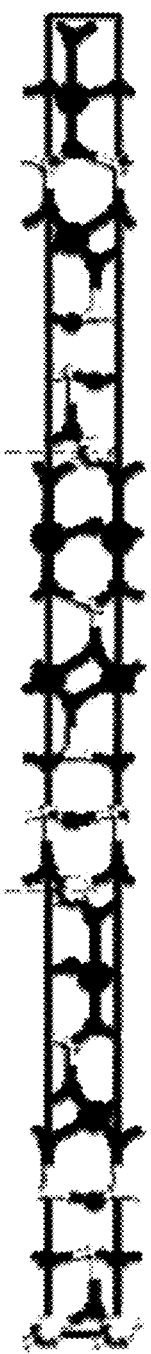

FIG. 13B illustrates a large group B including three medium groups.

Figure 13C:
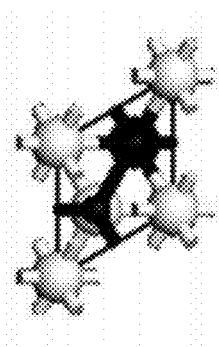

Note that FIG. 13C illustrates an atomic arrangement in the case where the layered structure in FIG. 13B is observed from the c-axis direction.

In the medium group A, a tricoordinate O atom is omitted, only the number of tetracoordinate O atoms is shown.

For example, three tetracoordinate O atoms existing in each of an upper half and a lower half with respect to a Sn atom are denoted by circled 3.

Similarly, in the medium group A, one tetracoordinate O atom existing in each of an upper half and a lower half with respect to an In atom is denoted by circled 1.

In addition, the medium group A illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group A included in the layered structure of the In—Sn—Zn—O-based material, in the order starting from the top, a Sn atom proximate to three tetracoordinate O atoms in each of an upper half and a lower half is bonded to an In atom proximate to one tetracoordinate O atom in each of an upper half and a lower half.

The In atom is bonded to a Zn atom proximate to three tetracoordinate O atoms in an upper half.

The Zn atom is bonded to an In atom proximate to three tetracoordinate O atoms in each of an upper half and a lower half through one tetracoordinate O atom in a lower half with respect to the Zn atom.

That In atom is bonded to a small group that includes two Zn atoms and that is proximate to one tetracoordinate O atom in an upper half.

The small group is bonded to a Sn atom proximate to three tetracoordinate O atoms in each of an upper half and a lower half through one tetracoordinate O atom in a lower half with respect to the small group.

A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Therefore, electric charge in a small group including a Sn atom is +1.

Therefore, electric charge of −1, which cancels +1, is needed to form a layered structure including a Sn atom.

As a structure having electric charge of −1, the small group including two Zn atoms as shown in the structure E can be given.

For example, with one small group including two Zn atoms, electric charge of one small group including a Sn atom can be cancelled, so that the total electric charge of the layered structure can be 0.

When the large group B is repeated, an In—Sn—Zn—O-based crystal ($In_2SnZn_3O_8$) can be obtained.

A layered structure of the obtained In—Sn—Zn—O-based crystal can be expressed as a composition formula, $In_2SnZn_2O_7(ZnO)_m$ (m is 0 or a natural number).

The variable m is preferably large because the larger the variable m, the higher the crystallinity of the In—Sn—Zn—O-based crystal.

The same applies to the case where an oxide semiconductor used is not In—Sn—Zn—O-based one.

Figure 14A:
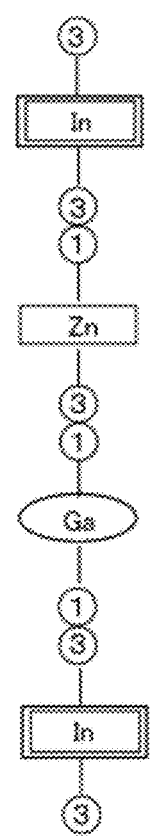
FIGS. 14A to 14C illustrate an example of an oxide semiconductor.

For example, FIG. 14A illustrates a model of a medium group L included in a layered structure of an In—Ga—Zn—O-based material.

In the medium group L included in the layered structure of the In—Ga—Zn—O-based material, in the order starting from the top, an In atom proximate to three tetracoordinate O atoms in each of an upper half and a lower half is bonded to a Zn atom proximate to one tetracoordinate O atom in an upper half.

The Zn atom is bonded to a Ga atom proximate to one tetracoordinate O atom in each of an upper half and a lower half through three tetracoordinate O atoms in a lower half with respect to the Zn atom.

The Ga atom is bonded to an In atom proximate to three tetracoordinate O atoms in each of an upper half and a lower half through one tetracoordinate O atom in a lower half with respect to the Ga atom.

A plurality of such medium groups are bonded, so that a large group is formed.

Figure 14B:
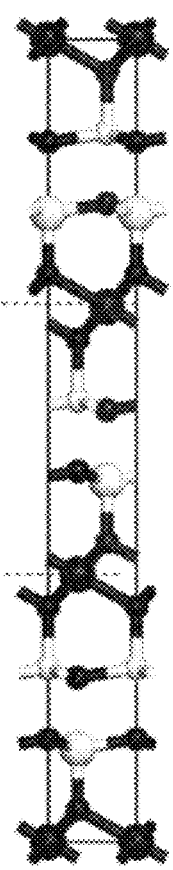

FIG. 14B illustrates a large group M including three medium groups.

Figure 14C:
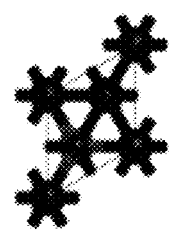

Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0.

As a result, the total electric charge of a medium group having a combination of such small groups is always 0.

In order to form the layered structure of the In—Ga—Zn—O-based material, a large group can be composed of not only the medium group L but also a medium group in which the arrangement of the In atom, the Ga atom, and the Zn atom is different from that of the medium group L. The contents of this embodiment or part thereof can be implemented in combination with any of the other embodiments and examples.

Embodiment 7

In this embodiment, the mobility of an oxide semiconductor used in one embodiment of the present invention will be described using formulae.

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured mobility of a semiconductor are $\mu_0$ and $\mu$ respectively, and a potential barrier (such as a grain boundary) exists in the semiconductor, the mobility $\mu$ can be expressed as Formula 1.

[Formula 1]

$$\mu = \mu_0 \exp\left(-\frac{E}{kT}\right) \quad (1)$$

E represents the height of the potential barrier, k represents the Boltzmann constant, and T represents the absolute temperature When the potential barrier is assumed to be attributed to a defect, Formula 2 can be obtained according to the Levinson model.

[Formula 2]

$$E = \frac{e^2 N^2}{8\varepsilon n} = \frac{e^3 N^2 t}{8\varepsilon C_{ox} V_g} \quad (2)$$

e represents the elementary charge, N represents the average defect density per unit area in a channel, c represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region can be expressed as Formula 3.

[Formula 3]

$$I_d = \frac{W\mu V_g V_d C_{ox}}{L} \exp\left(-\frac{E}{kT}\right) \quad (3)$$

L represents the channel length and W represents the channel width, and L and W are each 10 μm in this case.

In addition, $V_d$ represents the drain voltage.

When dividing both sides of the Formula 3 by $V_g$ and then taking logarithms of both sides, the Formula 4 can be obtained.

[Formula 4]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad (4)$$

The right side of Formula 4 is a function of $V_g$.

Formula 4 shows that the defect density N can be obtained from the slope of a line with $\ln(I_d/V_g)$ as the ordinate and $1/V_g$ as the abscissa.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/Vs.

The measured mobility of an In—Sn—Zn oxide including a defect is approximately 35 cm²/Vs.

However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by Formula 5.

[Formula 5]

$$\frac{1}{\mu_1} = \frac{1}{\mu_0} + \frac{D}{B}\exp\left(-\frac{x}{l}\right) \quad (5)$$

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches).

When D is increased (i.e., when the gate voltage is increased), the second term of Formula 5 is increased and accordingly the mobility $\mu_1$ is decreased.

Figure 15:
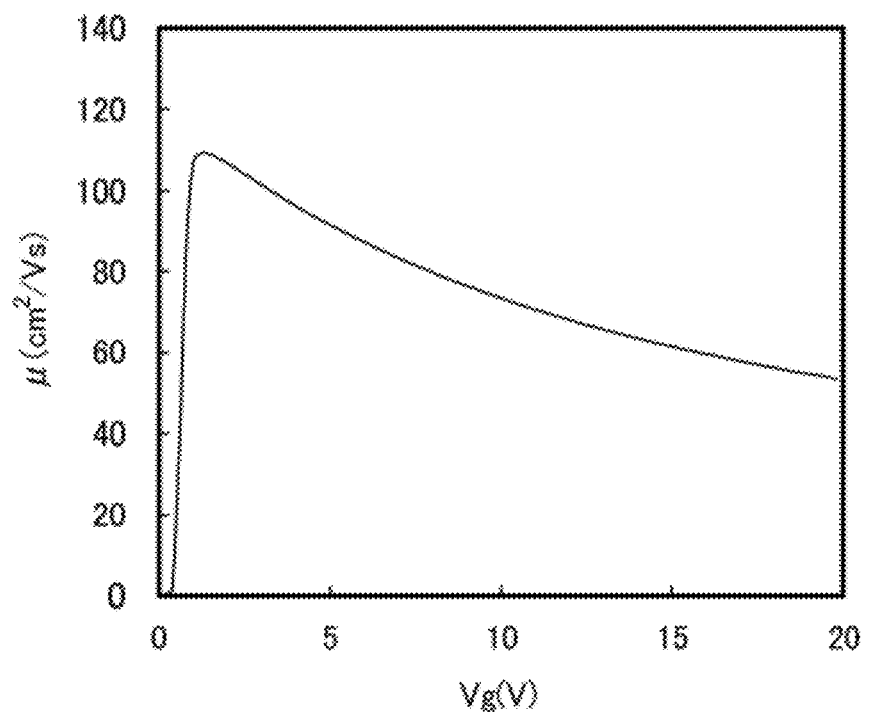
FIG. 15 shows a relation between gate voltage and field-effect mobility.

Calculation results of the mobility $\mu_2$ of a transistor whose channel includes an ideal oxide semiconductor without a defect inside the semiconductor are shown in FIG. 15.

For the calculation, device simulation software Sentaurus Device manufactured by Synopsys, Inc. was used For the calculation, the band gap, the electron affinity, the dielectric constant, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the dielectric constant thereof was assumed to be 4.1. The channel length and the channel width were each assumed to be 10 μm, and the drain voltage $V_d$ was assumed to be 0.1 V.

As shown in the calculation results, the mobility has a peak of greater than or equal to 100 cm²/Vs at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Characteristics of minute transistors which are manufactured using an oxide semiconductor having such mobility are calculated.

The transistor used for calculation includes a channel formation region provided between a pair of n-type semiconductor regions in the oxide semiconductor layer.

The calculation was performed under the condition that the resistivity of the pair of n-type semiconductor regions is $2 \times 10^{-3}$ Ωcm.

The calculation was performed under the condition that a channel length was 33 nm and a channel width was 40 nm.

Further, a sidewall is provided on the side wall of the gate electrode.

The calculation was performed under the condition that part of the semiconductor region which overlaps with the sidewall is an offset region.

For the calculation, Sentaurus Device which is software manufactured by Synopsys, Inc. was used.

Figure 16A:
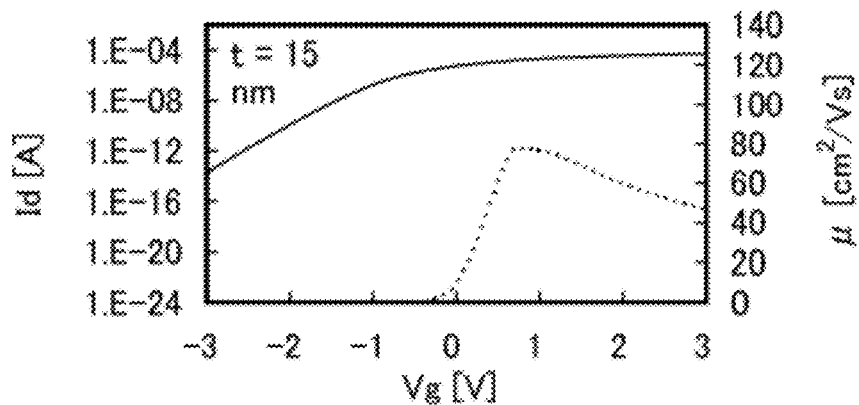
FIGS. 16A to 16C each show a relation between gate voltage and drain current.
Figure 16B:
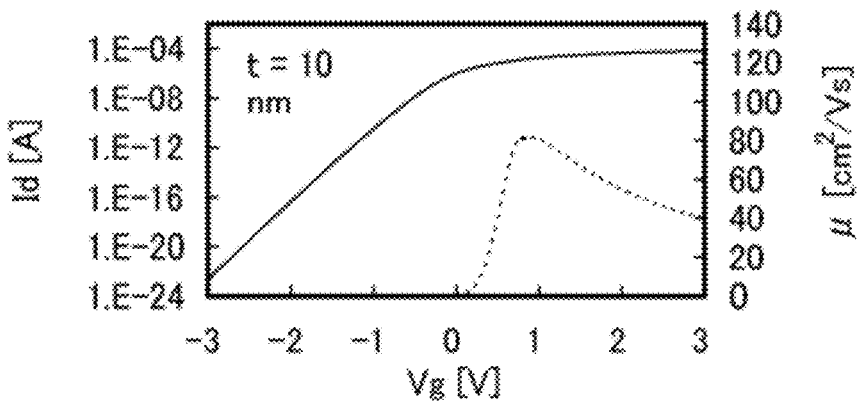
Figure 16C:
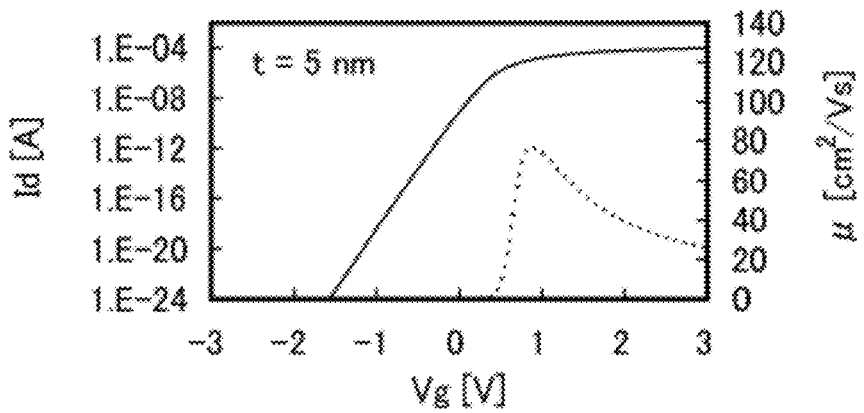

FIGS. 16A to 16C are calculation results of the gate voltage ($V_g$: a potential difference between the gate and the source) dependence of the drain current ($I_d$, solid line) and the mobility (m, dotted line) of the transistor.

The drain current $I_d$ is obtained by calculation under the condition that the drain voltage (a potential difference between the drain and the source) is +1 V and the mobility μ is obtained by calculation under the condition that the drain voltage is +0.1 V.

FIG. 16A shows the calculation result under the condition that the thickness of the gate insulating film is 15 nm.

FIG. 16B shows the calculation result under the condition that the thickness of the gate insulating film is 10 nm.

FIG. 16C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility μ and the drain current $I_d$ (on-state current) in an on state.

Figure 17A:
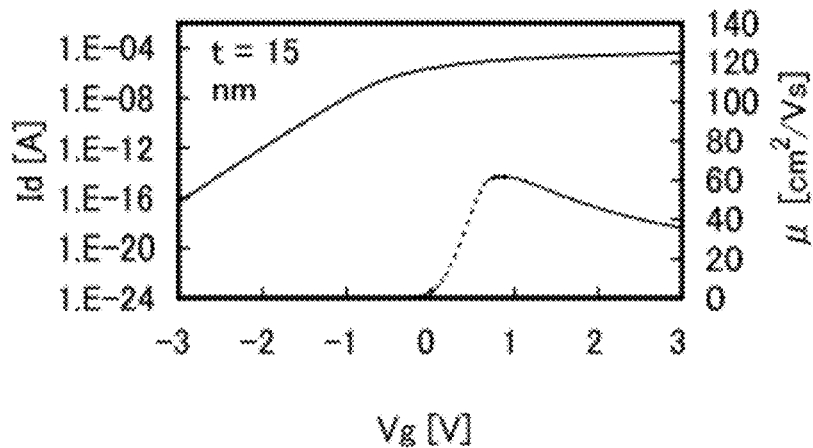
FIGS. 17A to 17C each show a relation between gate voltage and drain current.
Figure 17B:
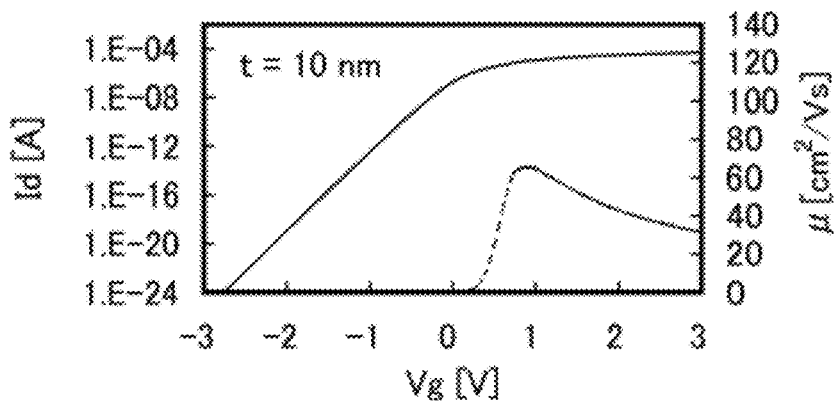
Figure 17C:
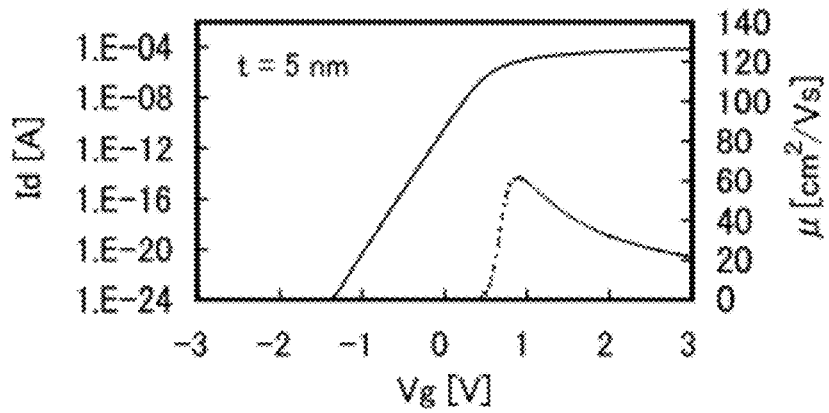

FIGS. 17A to 17C show the gate voltage $V_g$ dependence of the drain current $I_d$ (solid line) and the mobility μ (dotted line) under the condition that the offset length (sidewall length) $L_{off}$ is 5 nm.

The drain current $I_d$ is obtained by calculation under the condition that the drain voltage is +1 V and the mobility μ is obtained by calculation under the condition that the drain voltage is +0.1 V.

FIG. 17A shows the calculation result under the condition that the thickness of the gate insulating film is 15 nm.

FIG. 17B shows the calculation result under the condition that the thickness of the gate insulating film is 10 nm.

FIG. 17C shows the calculation result under the condition that the thickness of the gate insulating film is 5 nm.

FIGS. 17A to 17C show the gate voltage dependence of the drain current $I_d$ (solid line) and the mobility μ (dotted line) under the condition that the offset length (sidewall length) $L_{off}$ is 15 nm.

The drain current $I_d$ is obtained by calculation under the condition that the drain voltage is +1 V and the mobility μ is obtained by calculation under the condition that the drain voltage is +0.1 V.

Figure 18A:
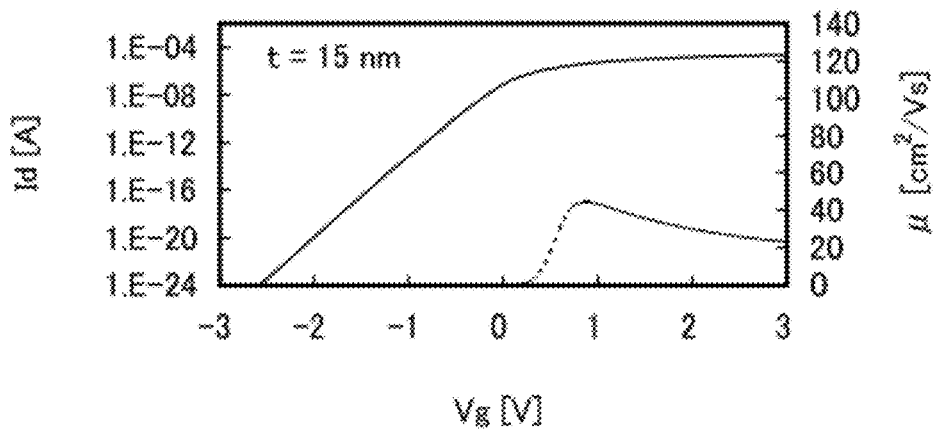
FIGS. 18A to 18C each show a relation between gate voltage and drain current.

FIG. 18A shows the calculation result under the condition that the thickness of the gate insulating film is 15 nm.

Figure 18B:
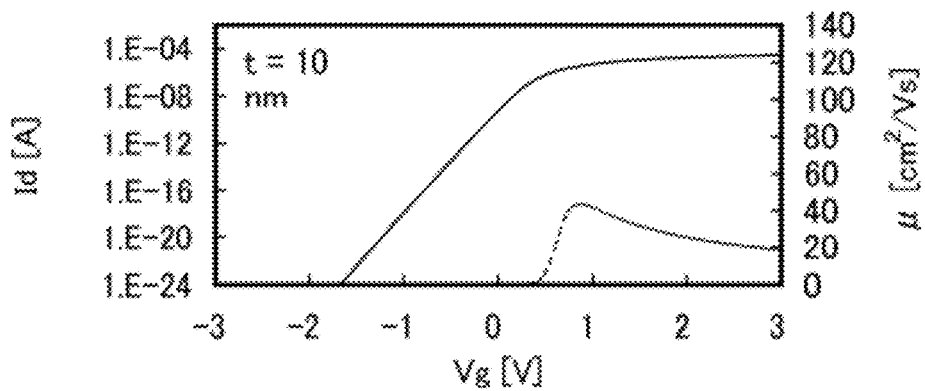

FIG. 18B shows the calculation result under the condition that the thickness of the gate insulating film is 10 nm.

Figure 18C:
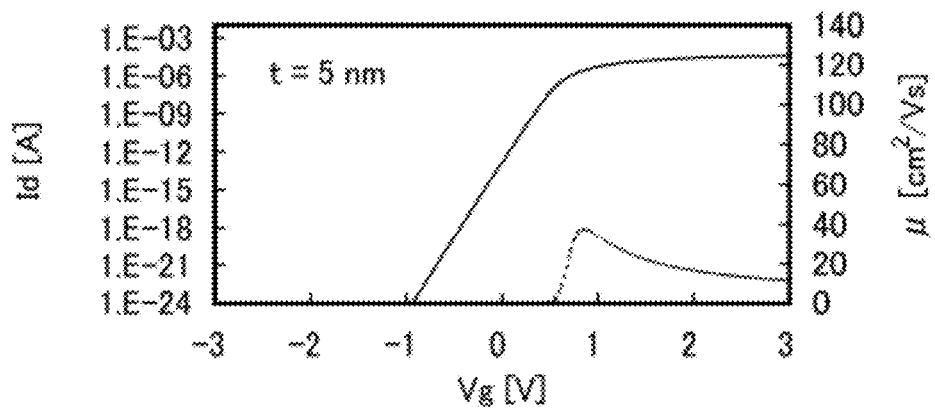

FIG. 18C shows the calculation result under the condition that the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 16A to 16C, approximately 60 cm²/Vs in FIGS. 17A to 17C, and approximately 40 cm²/Vs in FIGS. 18A to 18C; thus, the peak of the mobility μ is decreased as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V. The contents of this embodiment or part thereof can be implemented in combination with any of the other embodiments and examples.

Example 1

In this example, bottom-gate transistors whose thicknesses of gate insulating layers and the lengths of channel formation regions (channel lengths L) were different from each other were used and variations in the mobility among the transistors were measured. In addition, a change in an electric field due to the variation in the thickness of the gate insulating layer was calculated based on the measurement results.

First, a manufacturing method of the transistors used in this example will be described below.

First, silicon nitride oxide films each having a thickness of 100 nm were formed as base films over respective glass substrates using a CVD method.

Next, tungsten films each having a thickness of 150 nm were formed as gate electrodes by a sputtering method. Here, the tungsten films were selectively etched to form the gate electrodes.

Then, silicon oxide films each having a dielectric constant of 4.1 were formed for gate insulating layers over the respective gate electrodes by a plasma CVD method. Four kinds of thicknesses of the gate insulating layers, that is, 30 nm, 50 nm, 100 nm, and 200 nm are employed.

Next, oxide semiconductor films each having a thickness of 30 nm were formed over the respective gate insulating layers by a sputtering method using an In—Ga—Zn—O-based metal oxide target ($In_2O_3:Ga_2O_3:ZnO=1:1:1$ [molar ratio]) in a mixed atmosphere of argon and oxygen (argon:oxygen=30 sccm:15 sccm) at 200° C. under the following conditions: the distance between the substrate and the target was 60 mm, the pressure was 0.4 Pa, and the direct current (DC) power was 0.5 kW. Here, island-shaped oxide semiconductor layers were formed by selectively etching the oxide semiconductor films.

Then, heat treatment was performed at 450° C. for one hour in a nitrogen atmosphere using an oven.

Next, titanium films each having a thickness of 150 nm were formed for source electrodes and drain electrodes over the respective oxide semiconductor layers. Here, the tungsten films were selectively etched, so that a channel width W of each of the transistors was 50 μm. Seven kinds of channel lengths L of the transistors, that is, 2 μm, 4 μm, 10 μm, 20 μm, 50 μm, 100 μm, and 200 μm are employed.

Next, silicon oxide films each having a thickness of 600 nm were deposited by a sputtering method as interlayer films. After that, the interlayer layers and insulating layers were selectively etched to expose electrodes to be used for measurement.

Then, indium tin oxide films each having a thickness of 110 nm were formed by a sputtering method and were selectively etched, so that the electrodes were formed.

After that, baking was performed at 250° C. for one hour in a nitrogen atmosphere with the use of an oven.

Through the above-described steps, the transistors were manufactured.

Next, measurement and comparison in the mobility were performed on the above-manufactured transistors having different channel lengths L and including the gate insulating layers having different thicknesses. When the transistors were measured, 0 V and 10 V were applied to the source electrodes and the drain electrodes, respectively. Drain current was measured in such a manner that a voltage applied to the gate electrodes was changed from −20 V to +20 V in steps of 0.25 V. The value of measured drain current is substituted into a formula of the drain current in a saturation region, thereby calculating the field-effect mobility.

Figure 8:
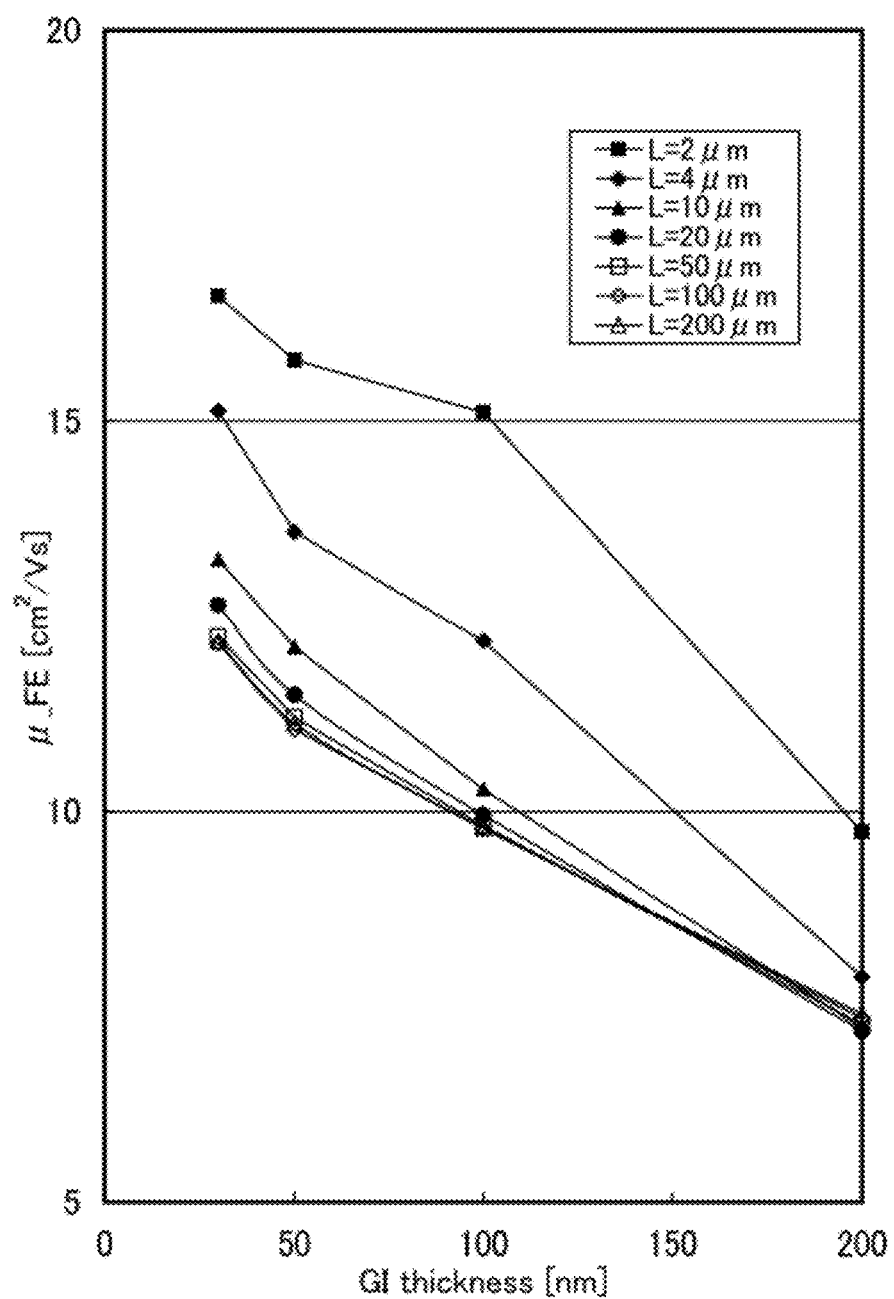
FIG. 8 shows experimental results of an example.

FIG. 8 is a graph showing the relation between the maximum value of the field-effect mobility in the saturation region calculated as described above and the thickness of the gate insulating layer, for each of the channel lengths.

It was found from FIG. 8 that the mobility of the transistor was reduced as the thickness of the gate insulating layer became larger irrespective of the channel length.

On the basis of the experimental data, a change in the electric field in the vicinity of the drain which depends on variations in the thicknesses of the second gate insulating layers 107$a$ and 107$b$ in the transistor of FIGS. 11A and 11B was calculated. Note that Sentaurus Device manufactured by Synopsys Inc. was used for the calculation.

First, transistors used in the calculation are described. Transistors each having a structure illustrated in FIGS. 11A and 11B were manufactured using the same material and manufacturing method as those of the transistor used for the measurement and an electric field generated in each of the transistors was calculated.

In the calculation performed on the individual transistors each having the structure illustrated in FIG. 11A, a tungsten film with a thickness of 150 nm was used as the gate electrode 103 and a silicon oxynitride film with a thickness of 30 nm was used for the first gate insulating layer 105. Four kinds of thicknesses, that is, 0 nm, 20 nm, 70 nm, and 150 nm were employed for the thickness of a silicon oxide film used for the second gate insulating layer 107$a$ and the second gate insulating layer 107$b$ in the calculation. An IGZO film with a thickness of 30 nm which had a band gap of 3.15 eV and an electron affinity of 4.3 eV was used for the oxide semiconductor layer 109. A titanium film with a thickness of 150 nm which had a work function of 4.0 eV was used for the source electrode 111 and the drain electrode 113. A silicon oxide film with a thickness of 200 nm was used for the insulating layer 115. Note that in each of the transistors used in the calculation, the thickness of the insulating layer 115 was 600 nm; however, the thickness of the insulating layer 115 may be 200 nm, which does not influence the calculation results.

In addition, the length of a region of the channel formation region which is in contact with the first gate insulating layer (the length of a region a in the channel length direction in FIG. 11A) was 2.5 μm. In the channel length L, the lengths (the lengths of regions b in the channel direction in FIG. 11A) of high resistance regions which overlap with a second insulating layer were each 1 μm measured from end portions of a source electrode and a drain electrode.

As for each of the transistors under the above conditions, calculation was performed on the electric field of the oxide semiconductor layer in a position just below and 1 nm apart from the end portion of the drain electrode in the case where 0 V, 10 V, and a voltage of −20 V to 0 V were applied to the source electrode, the drain electrode, and the gate electrode, respectively. The calculation results are shown in FIG. 9A.

Figure 9A:
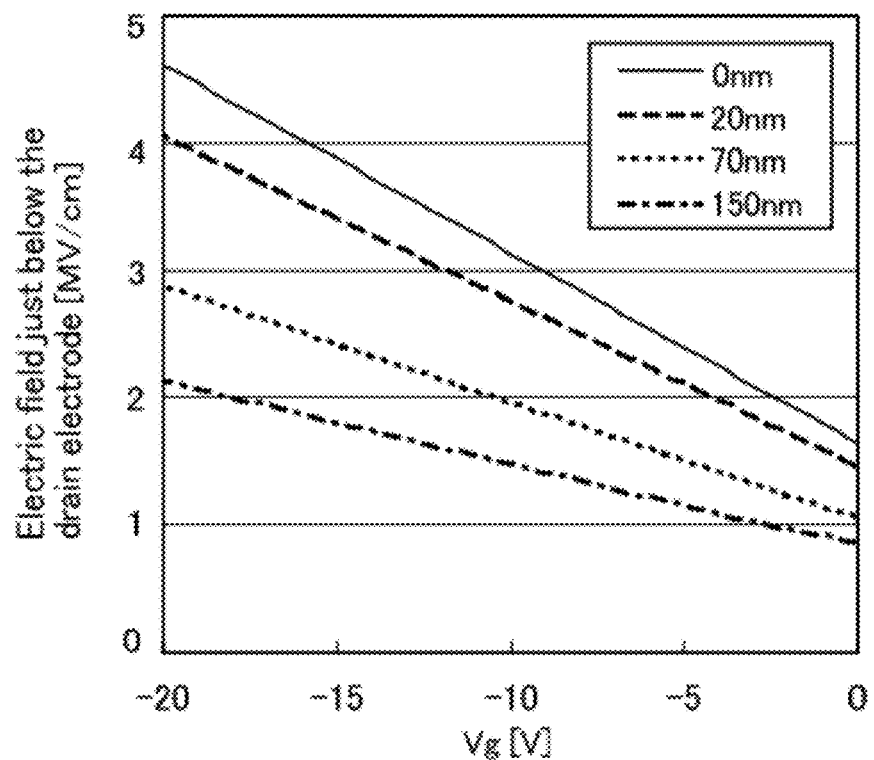
FIGS. 9A and 9B show calculation results of transistors according to one embodiment of the present invention.

FIG. 9A shows the intensities of electric fields just below the drain electrodes when a voltage of −20 V to 0 V was applied to the gate electrodes in the case where the second gate insulating layers have respective thicknesses of 0 nm, 20 nm, 70 nm, and 150 nm. It was found from FIG. 9A that a larger electric field was applied to the portion just below the drain electrode as the gate voltage becomes smaller.

Figure 9B:
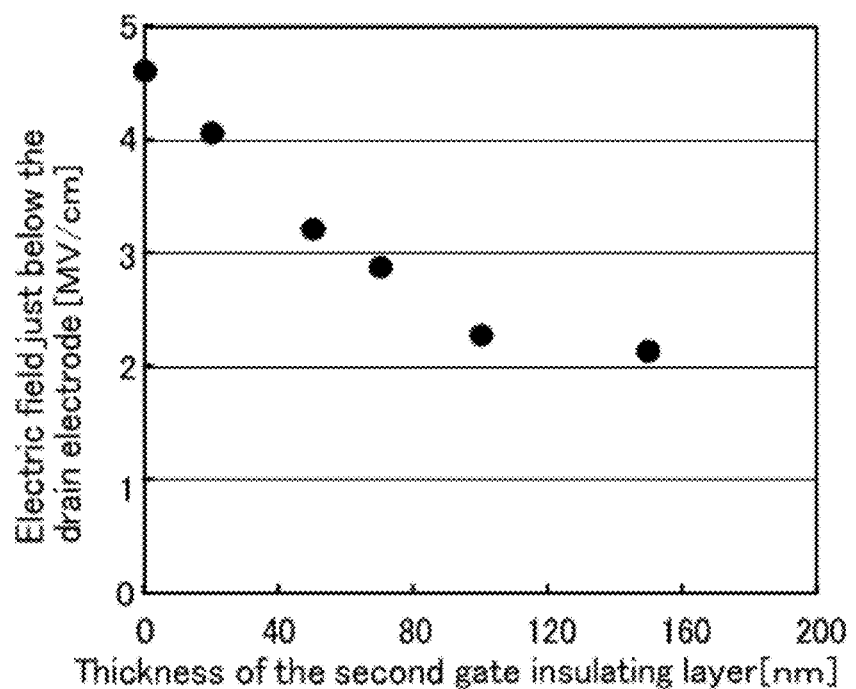

In order to see more details of the thickness of the gate insulating layer and the electric field just below the drain electrode under the condition where a high electric field is applied, FIG. 9B shows the relation between the thickness of the second gate insulating layer and the electric field just below the drain electrode in the case where −20 V is applied to the gate electrode.

As shown in FIG. 9B, when the thickness of the second gate insulating layer is increased, the electric field just below the drain electrode is reduced. In addition, FIG. 9B shows that a change in the electric field just below the drain electrode in response to variations in the thickness of the second gate insulating layer is gradually reduced when the thickness of the second gate insulating layer exceeds 100 nm, and becomes very small when the thickness of the second gate insulating layer exceeds 150 nm.

Thus, it is found that when the thickness of the second gate insulating layer is increased under the condition where a high electric field is applied, the electric field just below the drain electrode is reduced. In addition, it is also found that when the thickness of the second gate insulating layer is further increased, a reduction in the electric field becomes smaller.

Subsequently, in order to examine the electric field in the vicinity of the drain in more detail, calculation was performed on the electric field of the oxide semiconductor layer in the vicinity of the drain electrode of each of the transistors when −20 V was applied to the gate electrode in both of the case where the second gate insulating layer had a thickness of 0 nm and the case where the second gate insulating had a thickness of 150 nm.

Calculation conditions are as follows: the transistor having the structure illustrated in FIG. 1B, in which the same thickness and material as the transistor used for the above calculation are used was considered, and 0 V, 10 V and −20V were applied to the source electrode, the drain electrode, and the gate electrode, respectively. Under such calculation conditions, electric field intensity distribution of the oxide semiconductor layer 109 in the vicinity of the drain electrode was calculated in the case where the second gate layer had a thickness of 0 nm and the case where the second gate layer had a thickness of 150 nm.

Figure 10A:
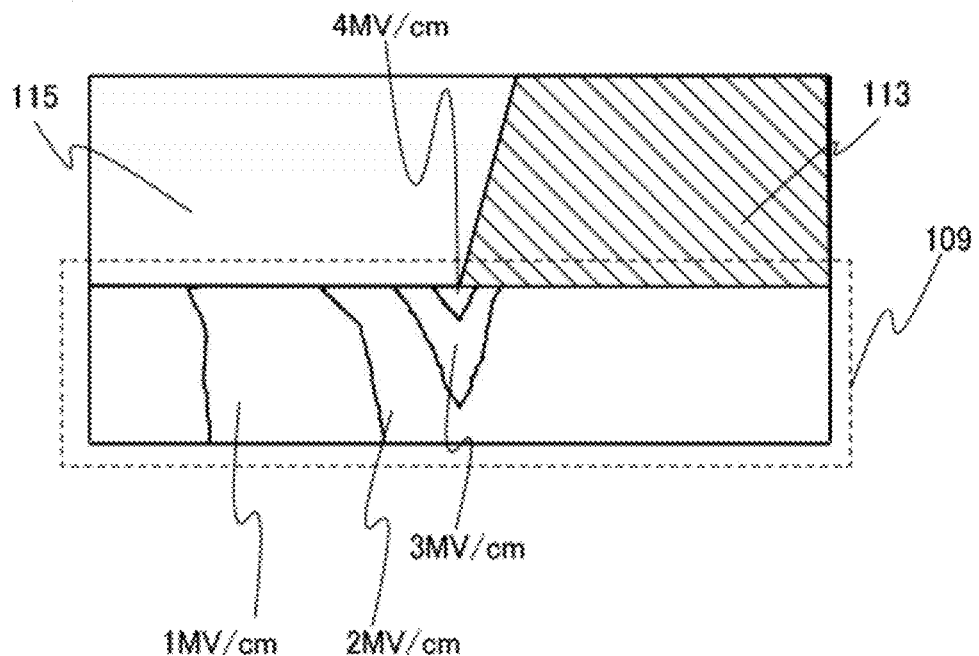
FIGS. 10A and 10B show calculation results of transistors according to one embodiment of the present invention.
Figure 10B:
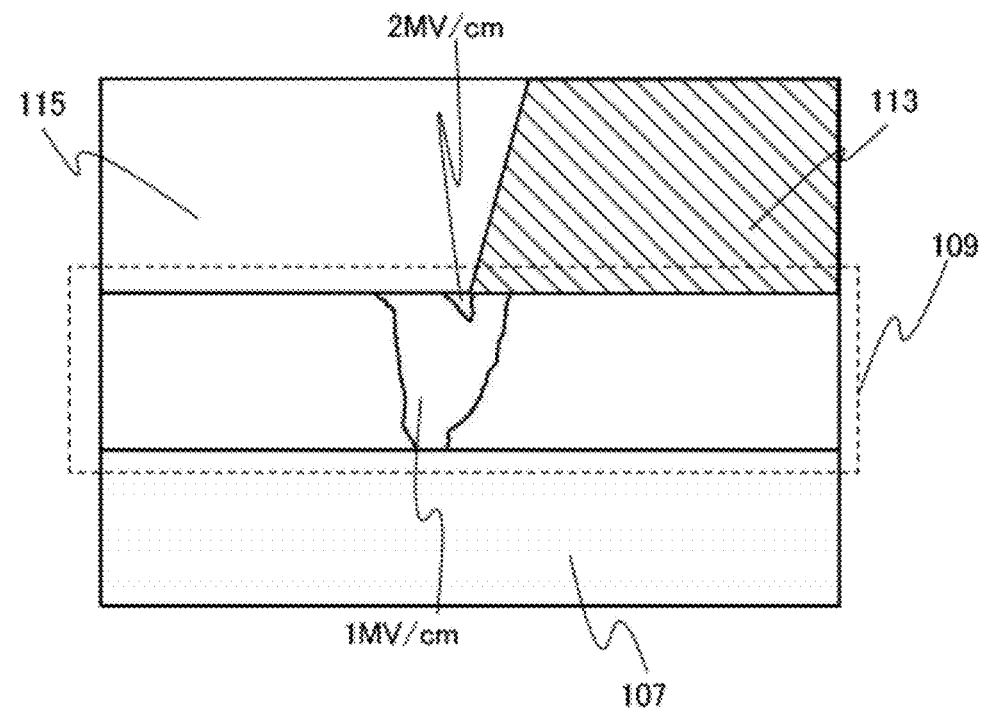

FIGS. 10A and 10B are enlarged views each illustrating a region and the vicinity thereof where the end portion of the drain electrode 113 and the oxide semiconductor layer 109 in the transistor illustrated in FIG. 1A overlap with each other, and each show calculation results of the electric intensity distribution of the oxide semiconductor layer in the vicinity of the drain electrode. FIG. 10A shows the electric field intensity distribution of the oxide semiconductor layer in the case where the second gate insulating has a thickness of 0 nm, and FIG. 10B shows the electric field intensity distribution of the oxide semiconductor layer in the case where the second gate insulating layer has a thickness of 150 nm.

In FIGS. 10A and 10B, a region denoted by 4 MV/cm is a region whose electric field intensity is greater than or equal to 4 MV/cm, a region denoted by 3 MV/cm is a region whose electric field intensity is greater than or equal to 3 MV/cm and less than 4 MV/cm, a region denoted by 2 MV/cm is a region whose electric field intensity is greater than or equal to 2 MV/cm and less than 3 MV/cm, a region denoted by 1 MV/cm is a region whose electric field intensity is greater than or equal to 1 MV/cm and less than 2 MV/cm, and the other region is a region whose electric field intensity is less than 1 MV/cm.

In FIG. 10A, the high electric field whose intensity is greater than or equal to 4 MV/cm is concentrated at the end portion of the drain; in FIG. 10B, the intensity of the electric field even at the end portion of the drain is greater than or equal to 2 MV/cm and less than 3 MV/cm. Accordingly, it is found that when the thickness of the second gate insulating layer is increased, the electric field in the vicinity of the drain electrode is relaxed.

Thus, it can be confirmed that when the thickness of the gate insulating layer is increased depending on the structure including the second gate insulating layer, the electric field in the vicinity of the drain electrode is relaxed, and thus breakdown of the transistor does not easily occur even when a high voltage is applied to the transistor.

Example 2

In this example, calculation results of the mobility of a transistor whose channel formation region includes an ideal oxide semiconductor without a defect inside the semiconductor will be described.

A transistor including an oxide semiconductor containing In, Sn, and Zn can have favorable characteristics by deposition of the oxide semiconductor while heating a substrate or by heat treatment after deposition of an oxide semiconductor film.

Note that each of In, Sn, and Zn is preferably included in a composition at 5 atomic % or more.

By intentionally heating the substrate after the deposition of the oxide semiconductor film containing In, Sn, and Zn, the field-effect mobility of the transistor can be improved. Further, the threshold voltage of an n-channel transistor can be shifted in the positive direction.

The threshold voltage of the n-channel transistor is shifted in the positive direction, so that the absolute value of a voltage for maintaining the off state of the n-channel transistor can be reduced; thus, low power consumption can be achieved.

In addition, when the threshold voltage of the n-channel transistor is shifted in the positive direction to 0 V or more, a normally-off transistor can be obtained.

The characteristics of a transistor including an oxide semiconductor containing In, Sn, and Zn will be described below.

(Common Conditions of Sample a to Sample C)

An oxide semiconductor layer was formed over a substrate to have a thickness of 15 nm under the following conditions: a target having a composition ratio of In:Sn:Zn=1:1:1 is used; the gas flow rate is $Ar/O_2=6/9$ sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm. The tungsten layer was etched, so that a source electrode and a drain electrode were formed.

After that, a silicon oxynitride (SiON) film was formed as a gate insulating layer to have a thickness of 100 nm by plasma CVD using a silane ($SiH_4$) gas and dinitrogen monoxide ($N_2O$) gas.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film with a thickness of 300 nm and a polyimide film with a thickness of 1.5 μm were formed as an interlayer insulating film by plasma CVD.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was formed.

(Sample A)

In Sample A, heating was not intentionally performed to the substrate during the deposition of the oxide semiconductor layer.

Further in Sample A, heat treatment was not performed in a period after the oxide semiconductor layer was deposited before the oxide semiconductor layer was etched.

(Sample B)

In Sample B, the oxide semiconductor layer was deposited while the substrate was heated at 200° C.

Further in Sample B, heat treatment was not performed in a period after the oxide semiconductor layer was deposited before the oxide semiconductor layer was etched.

The oxide semiconductor layer was deposited while the substrate was heated in order to remove hydrogen serving as a donor in the oxide semiconductor layer.

(Sample C)

In Sample C, the oxide semiconductor layer was deposited while the substrate was heated at 200° C.

Further in Sample C, heat treatment in a nitrogen atmosphere was performed at 650° C. for one hour and then heat treatment in an oxygen atmosphere was performed at 650° C. for one hour after the oxide semiconductor layer was deposited before the oxide semiconductor layer was etched.

The heart treatment was performed in a nitrogen atmosphere at 650° C. for one hour in order to remove hydrogen serving as a donor in the oxide semiconductor layer.

With the heat treatment for removing hydrogen serving as a donor in the oxide semiconductor layer, oxygen is also removed to form oxygen vacancy serving as a carrier in the oxide semiconductor layer.

Thus, the heat treatment in an oxygen atmosphere at 650° C. for one hour was performed for reduction in oxygen vacancy.

(Characteristics of Transistors in Sample A to Sample C)

Figure 19A:
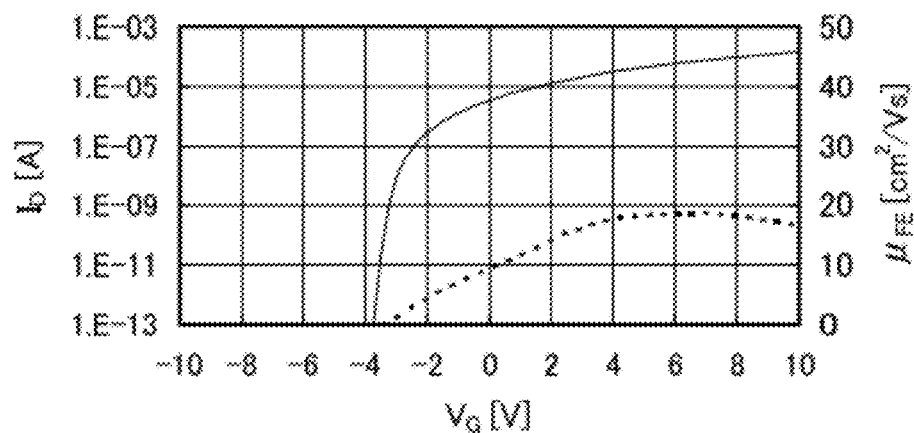
FIGS. 19A to 19C show characteristics of transistors.

FIG. 19A shows initial characteristics of a transistor in Sample A.

Figure 19B:
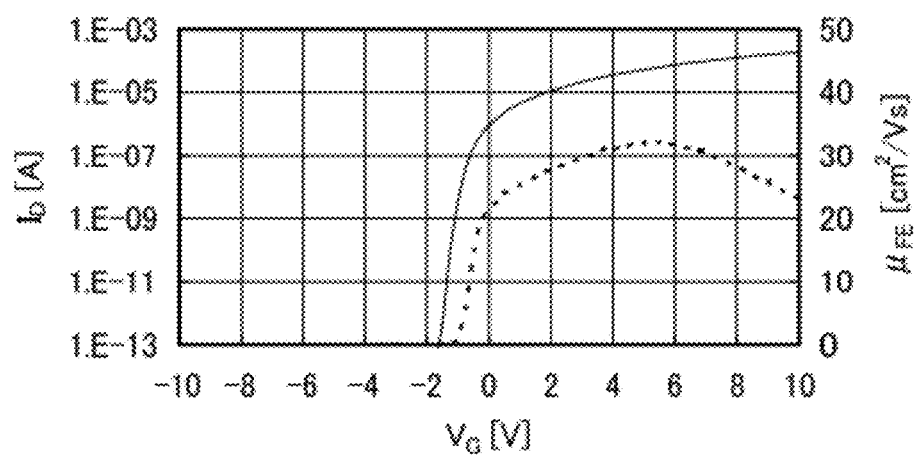

FIG. 19B shows initial characteristics of a transistor in Sample B.

Figure 19C:
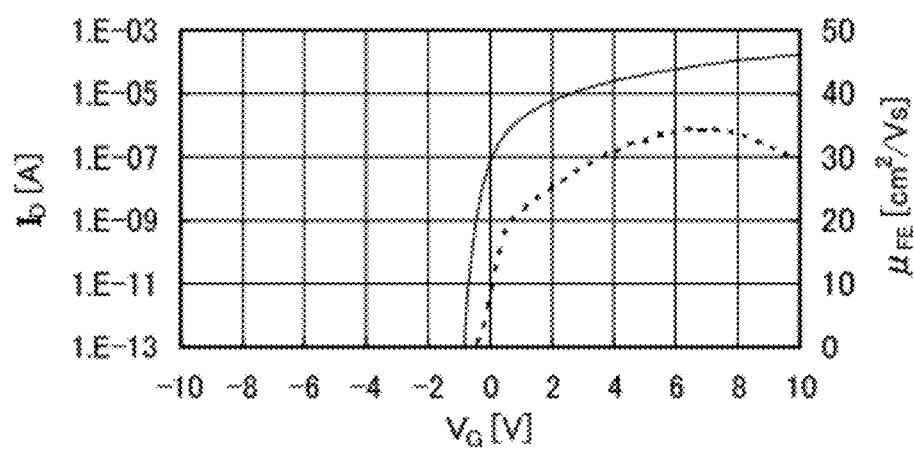

FIG. 19C shows initial characteristics of a transistor in Sample C.

The field-effect mobility of the transistor in Sample A was 18.8 cm$^2$/Vsec.

The field-effect mobility of the transistor in Sample B was 32.2 cm$^2$/Vsec.

The field-effect mobility of the transistor in Sample C was 34.5 cm$^2$/Vsec.

According to observations of cross sections of oxide semiconductor layers, which were formed by deposition methods similar to respective those of Sample A to Sample C, with a transmission electron microscope (TEM), crystallinity was observed in samples formed by the deposition methods similar to respective those of Sample B and Sample C whose substrates have been heated during deposition.

The sample whose substrate had been heated during deposition had a non-crystalline portion and a crystalline portion was aligned in the c-axis direction.

In a normal polycrystal, the crystalline portion is not aligned. Therefore, the sample whose substrate has been heated during deposition, has a novel crystal structure.

Comparison of FIG. 19A to FIG. 19C leads to understanding that heat treatment performed to the substrate during or after deposition can remove an hydrogen element serving as a donor, so that the threshold voltage of the n-channel transistor can be shifted in the positive direction.

That is, the threshold voltage of Sample B in which heating was performed to the substrate during deposition is shifted in the positive direction more than the threshold voltage of Sample A in which heating was not performed to the substrate during deposition In addition, comparing Sample B and Sample C, substrates of which were heated during deposition, it is found that the threshold voltage of Sample C in which heat treatment was performed after deposition is shifted in the positive direction more than the threshold voltage of Sample B in which heat treatment was not performed after deposition.

Furthermore, the higher the temperature of heat treatment is, the more the light element such as a hydrogen element tends to be removed; thus, hydrogen is more likely to be removed as the temperature of heat treatment is higher.

It was therefore found that the threshold voltage can be shifted more in the positive direction by further increasing of the temperature of heat treatment.

(Results of the Gate BT Stress Test of Sample B and Sample C)

The gate BT stress test was performed on Sample B (without heat treatment after deposition) and Sample C (with heat treatment after deposition).

First, $V_g$-$I_d$ characteristics of the transistors were measured at a substrate temperature of 25° C. and $V_d$ of 10 V to measure characteristics of the transistors before heat treatment and high positive voltage application.

Then, the substrate temperature was set to 150° C. and $V_d$ was set to 0.1 V.

After that, 20 V of $V_g$ was applied to the gate insulating film and the condition was kept for one hour.

Next, $V_g$ was set to 0 V.

Then, $V_g$-$I_d$ characteristics of the transistors were measured at a substrate temperature of 25° C. and $V_d$ of 10 V to measure characteristics of the transistors after heat treatment and high positive voltage application.

Comparing characteristics of transistors before and after heat treatment and high positive voltage application in the above manner is called a positive BT test.

In a similar manner, $V_g$-$I_d$ characteristics of the transistors were measured at a substrate temperature of 25° C. and $V_d$ of 10 V to measure characteristics of the transistors before heat treatment and high negative voltage application.

Then, the substrate temperature was set to 150° C. and $V_d$ was set to 0.1 V.

After that, −20 V of $V_g$ was applied to the gate insulating film and the condition was kept for one hour.

Next, $V_g$ was set to 0 V.

Then, $V_g$-$I_d$ characteristics of the transistors were measured at a substrate temperature of 25° C. and $V_d$ of 10 V to measure characteristics of the transistors after heat treatment and high negative voltage application.

Comparing characteristics of transistors before and after heat treatment and high negative voltage application in the above manner is called a negative BT test.

Figure 20A:
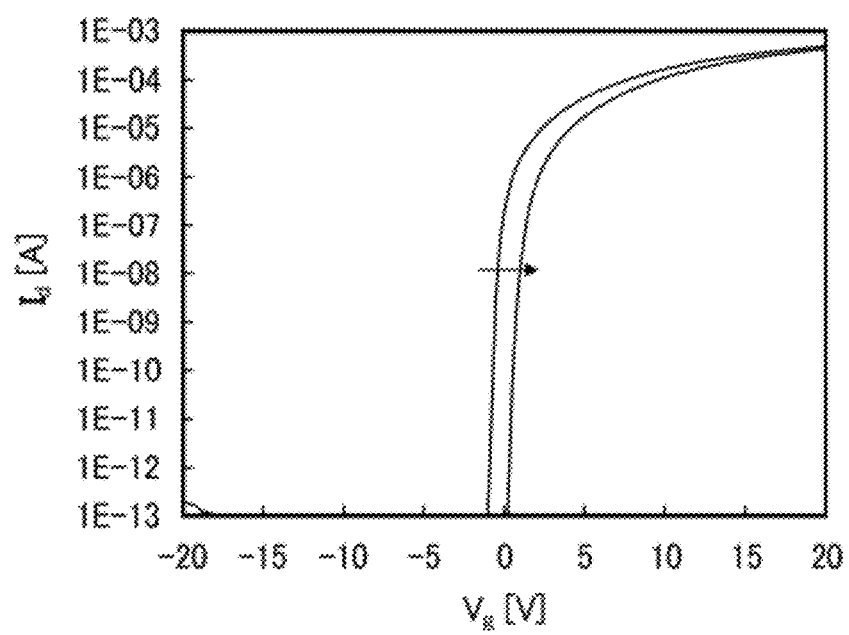
FIGS. 20A and 20B show characteristics of transistors.
Figure 20B:
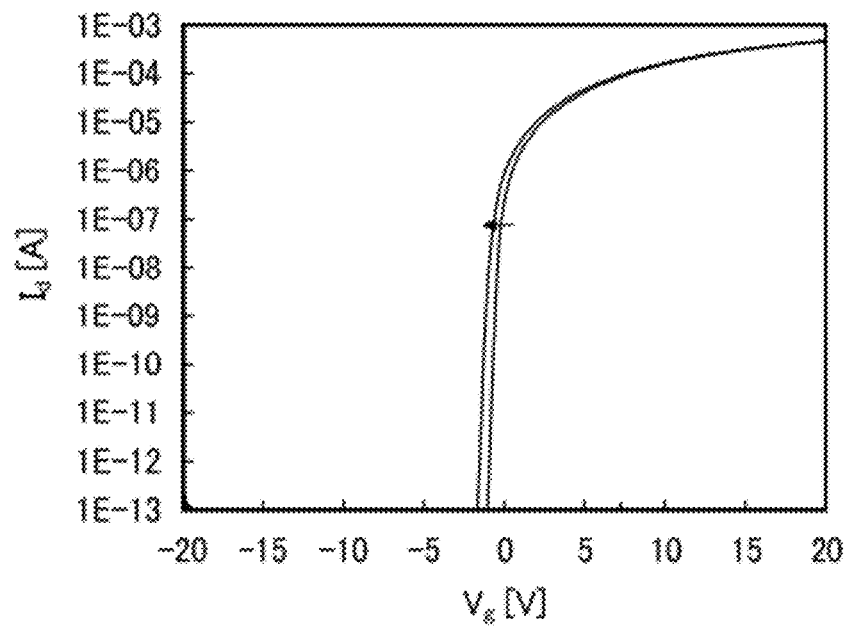

FIG. 20A shows a result of the positive BT test of Sample B and FIG. 20B shows a result of the negative BT test of Sample B.

Figure 21A:
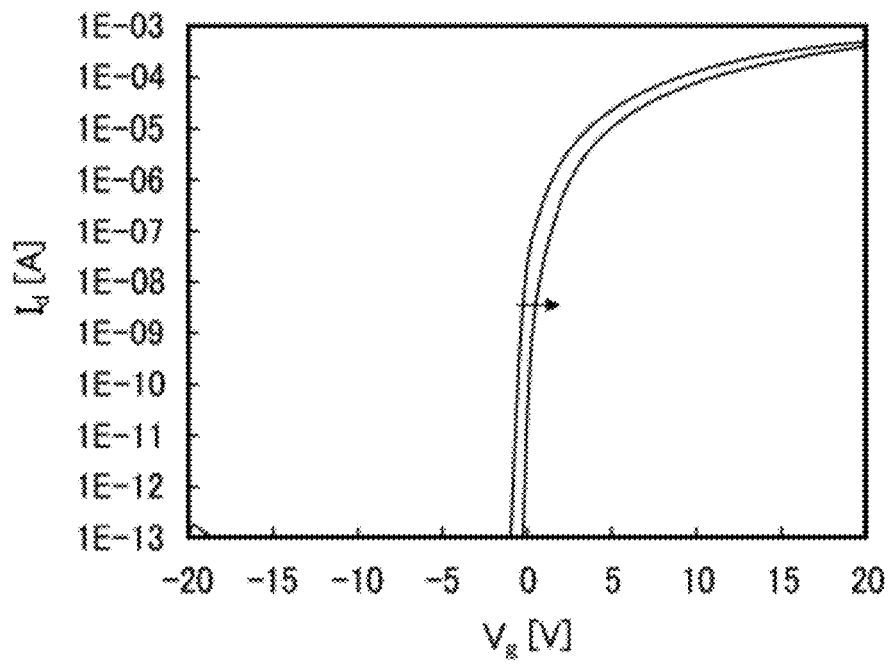
FIGS. 21A and 21B show characteristics of transistors.
Figure 21B:
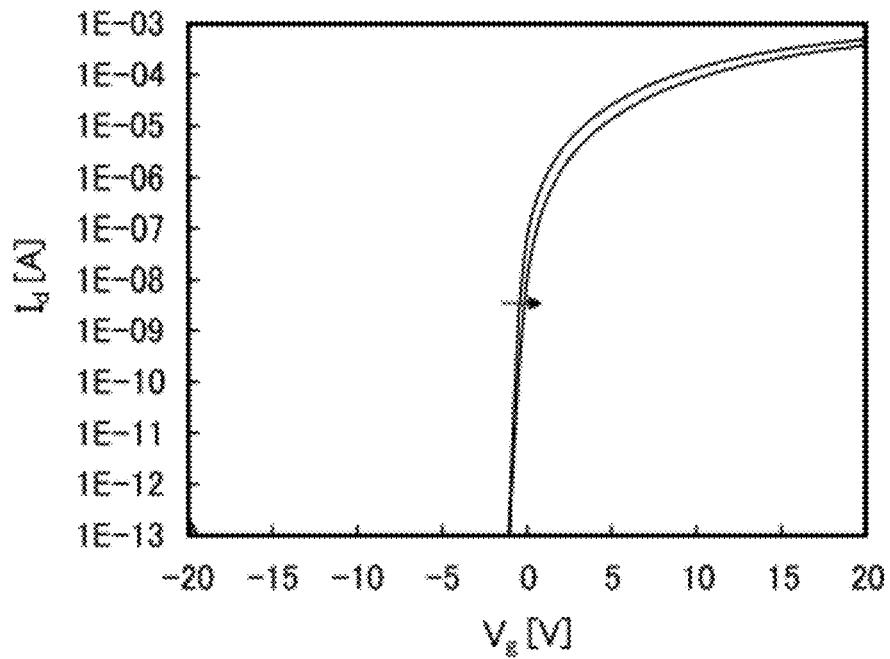

FIG. 21A shows a result of the positive BT test of Sample C and FIG. 21B shows a result of the negative BT test of Sample C.

Although the positive BT test and the negative BT test are tests used to determine the deterioration level of a transistor, with reference to FIG. 20A and FIG. 21A, it is found that the threshold voltage can be shifted in the positive direction by performing at least the positive BT test.

In FIG. 20A shows that a transistor becomes a normally-off transistor by being subjected to the positive BT test.

Therefore, it is revealed that the shift of the threshold voltage in the positive direction can be increased and a normally-off transistor can be formed by performing the positive BT test in addition to the heat treatment at the time of manufacturing the transistor.

Figure 22:
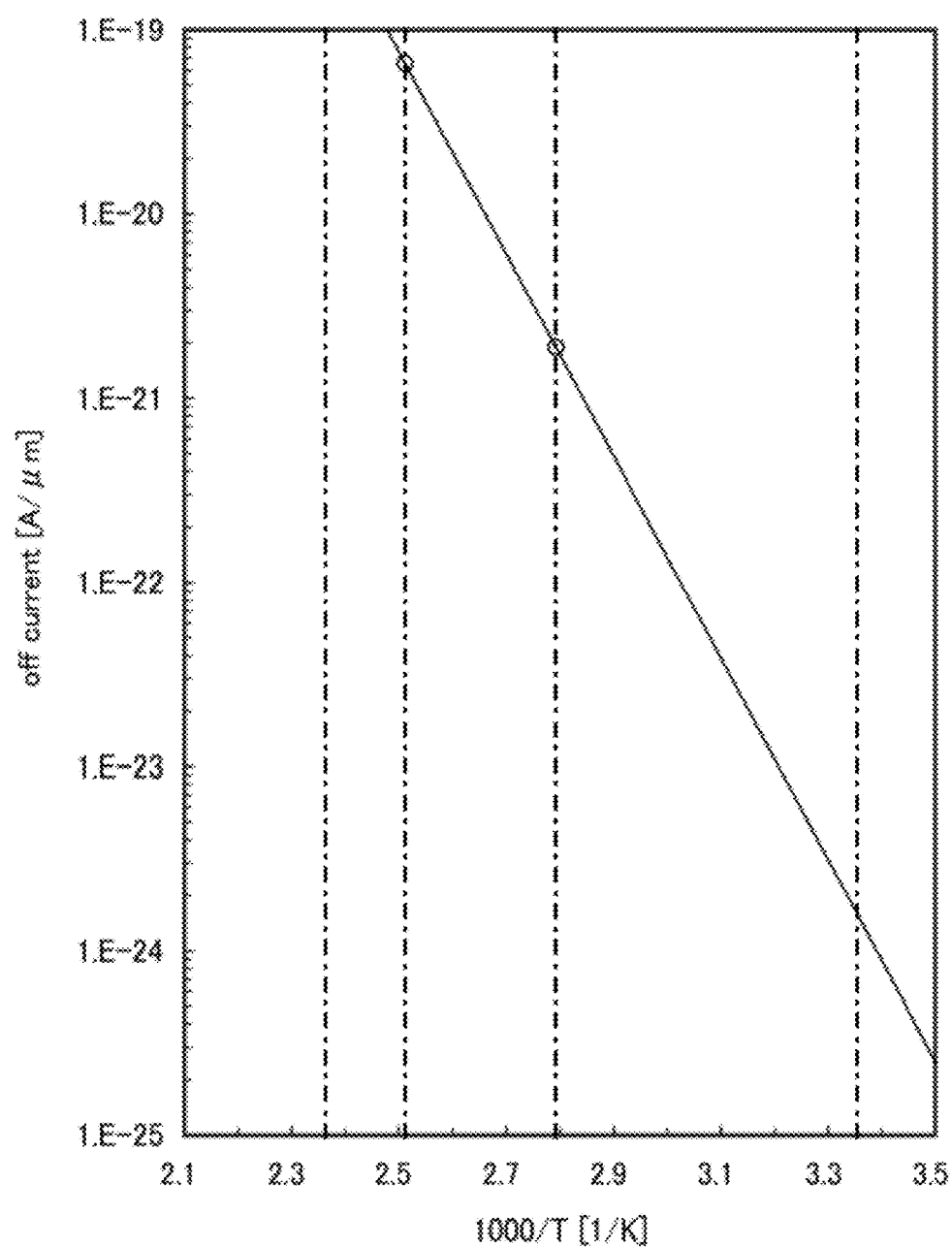
FIG. 22 shows temperature dependence of off-state current of a transistor.

FIG. 22 shows a relation between the off-state current of a transistor in Sample A and the inverse of substrate temperature (absolute temperature) at measurement.

Here, the abscissa represents a value (1000/T) obtained by multiplying an inverse of substrate temperature at measurement by 1000.

Note that FIG. 22 illustrates the amount of current in the case where the channel width is 1 μm.

The off-state current was lower than or equal to $1 \times 10^{-19}$ A when the substrate temperature was 125° C. (1000/T is about 2.51).

Further, the off-state current was lower than or equal to $1 \times 10^{-20}$ A when the substrate temperature was 85° C. (1000/T is about 2.79).

That is, it is found that the off-state current is extremely low compared to a transistor including a silicon semiconductor.

Note that as the temperature is lower, the off-state current is decreased; thus, it is clear that the off-state current at room temperature is further lower.

This application is based on Japanese Patent Application serial No. 2011-021042 filed with Japan Patent Office on Feb. 2, 2011 and Japanese Patent Application serial No. 2011-108901 filed with Japan Patent Office on May 14, 2011, the entire contents of which are hereby incorporated by reference.

What is claimed is:

1. A semiconductor device comprising:
a gate electrode;
a gate insulating layer over the gate electrode, wherein the gate insulating layer includes a first region, a second region, and a third region between the first region and the second region;
an oxide semiconductor layer over the gate insulating layer;
a first electrode over the gate insulating layer, wherein a part of the first electrode is over and in contact with one end portion of the oxide semiconductor layer; and
a second electrode over the gate insulating layer, wherein a part of the second electrode is over and in contact with the other end portion of the oxide semiconductor layer,
wherein in the first region, one end portion of the first electrode, the oxide semiconductor layer, and the gate electrode overlap each other,
wherein in the second region, one end portion of the second electrode, the oxide semiconductor layer, and the gate electrode overlap each other, and
wherein a thickness of the first region and a thickness of the second region are larger than a thickness of the third region.

2. The semiconductor device according to claim 1, wherein the gate insulating layer in the first region and the second region is formed of stacked layers.

3. The semiconductor device according to claim 2,
wherein the first region includes a first gate insulating layer and a second gate insulating layer,
wherein the second region includes the first gate insulating layer and a third gate insulating layer,
wherein the second gate insulating layer and the third gate insulating layer are over the first gate insulating layer, and
wherein a thickness of the second gate insulating layer and a thickness of the third gate insulating layer are larger than or equal to 100 nm.

4. The semiconductor device according to claim 3,
wherein the first gate insulating layer protrudes from the first electrode in a direction orthogonal to a channel length direction when seen from the above.

5. The semiconductor device according to claim 3,
wherein the second gate insulating layer protrudes from the second electrode in a direction orthogonal to a channel length direction when seen from the above.

6. The semiconductor device according to claim 1, wherein the gate insulating layer in the first region and the second region is formed of a low-k material.

7. The semiconductor device according to claim 1, wherein the semiconductor device is incorporated in one selected from the group consisting of a laptop personal computer and a mobile phone.

8. The semiconductor device according to claim 1,
wherein the thickness of the first region and the thickness of the second region are larger than the thickness of the third region by 100 nm.

9. A semiconductor device comprising:
a gate electrode;
a gate insulating layer over the gate electrode;
an oxide semiconductor layer provided over the gate insulating layer and overlapping with the gate electrode;
a first electrode in contact with the oxide semiconductor layer; and
a second electrode provided in contact with the oxide semiconductor layer with a space between the first electrode and the second electrode,
wherein the gate insulating layer includes:
a first region;
a second region overlapping with one end portion of the second electrode, the oxide semiconductor layer, and the gate electrode;
a third region sandwiched between the first region and the second region and provided in contact with the first region with a space provided between the second region and the third region;
a fourth region sandwiched between the third region and the second region and provided in contact with the second region with a space between the third region and the fourth region; and
a fifth region sandwiched between the third region and the fourth region,
wherein each of a capacitance of the first region, a capacitance of the second region, a capacitance of the third region, and a capacitance of the fourth region is smaller than a capacitance of the fifth region, and
wherein in the first region, one end portion of the first electrode, the oxide semiconductor layer, and the gate electrode overlap each other.

10. The semiconductor device according to claim 9, wherein the first region, the second region, the third region, and the fourth region are formed of stacked layers.

11. The semiconductor device according to claim 9, wherein the first region, the second region, the third region, and the fourth region are formed of low-k materials.

12. The semiconductor device according to claim 9, wherein the semiconductor device is incorporated in one selected from the group consisting of a laptop personal computer and a mobile phone.

* * * * *